(12) United States Patent
Freymuth

(10) Patent No.: US 6,484,302 B1
(45) Date of Patent: Nov. 19, 2002

(54) AUTO-CONTACTOR SYSTEM AND METHOD FOR GENERATING VARIABLE SIZE CONTACTS

(75) Inventor: Christopher A Freymuth, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 159 days.

(21) Appl. No.: 09/614,032

(22) Filed: Jul. 11, 2000

(51) Int. Cl.[7] .................................................. G06F 9/45
(52) U.S. Cl. .................................. 716/10; 716/8; 716/9; 716/11
(58) Field of Search ......................... 716/1–21; 438/31, 438/398, 619, 622; 257/5, 508, 522, 664, 758, 762

(56) References Cited

U.S. PATENT DOCUMENTS

| | | | |
|---|---|---|---|
| 4,890,238 A | * 12/1989 | Klein et al. ..................... 716/7 |
| 5,620,916 A | 4/1997 | Eden et al. | |
| 5,798,937 A | 8/1998 | Bracha et al. | |
| 6,226,782 B1 | * 5/2001 | Nowak et al. ................ 716/19 |

FOREIGN PATENT DOCUMENTS

EP          1102182 A2     5/2001

* cited by examiner

*Primary Examiner*—Matthew Smith
*Assistant Examiner*—Naum Levin

(57) ABSTRACT

An auto-contactor system and method are provided for optimizing the size and placement of contact elements for connecting signal lines from one layer of an integrated circuit to another layer of the integrated circuit. The auto-contactor system includes a contact area mechanism and an optimizing mechanism. The contact area mechanism identifies a contact area that overlaps the signal line from the first layer of the integrated circuit and the signal line on the second layer of the integrated circuit. The optimizing mechanism calculates an optimal size of a plurality of contacts in the contact area. The auto-contactor system also provides for and can be thought of as a method that optimizes the placement and size of contact elements for connecting signal lines on a first layer of the integrated circuit to signal lines on a second layer of the integrated circuit that comprises the following steps: (1) identifying a contact area that overlaps the signal lines from the first layer of the integrated circuit and the second layer of the integrated circuit; and (2) calculating an optimal size of a plurality of contacts in the contact area.

21 Claims, 20 Drawing Sheets

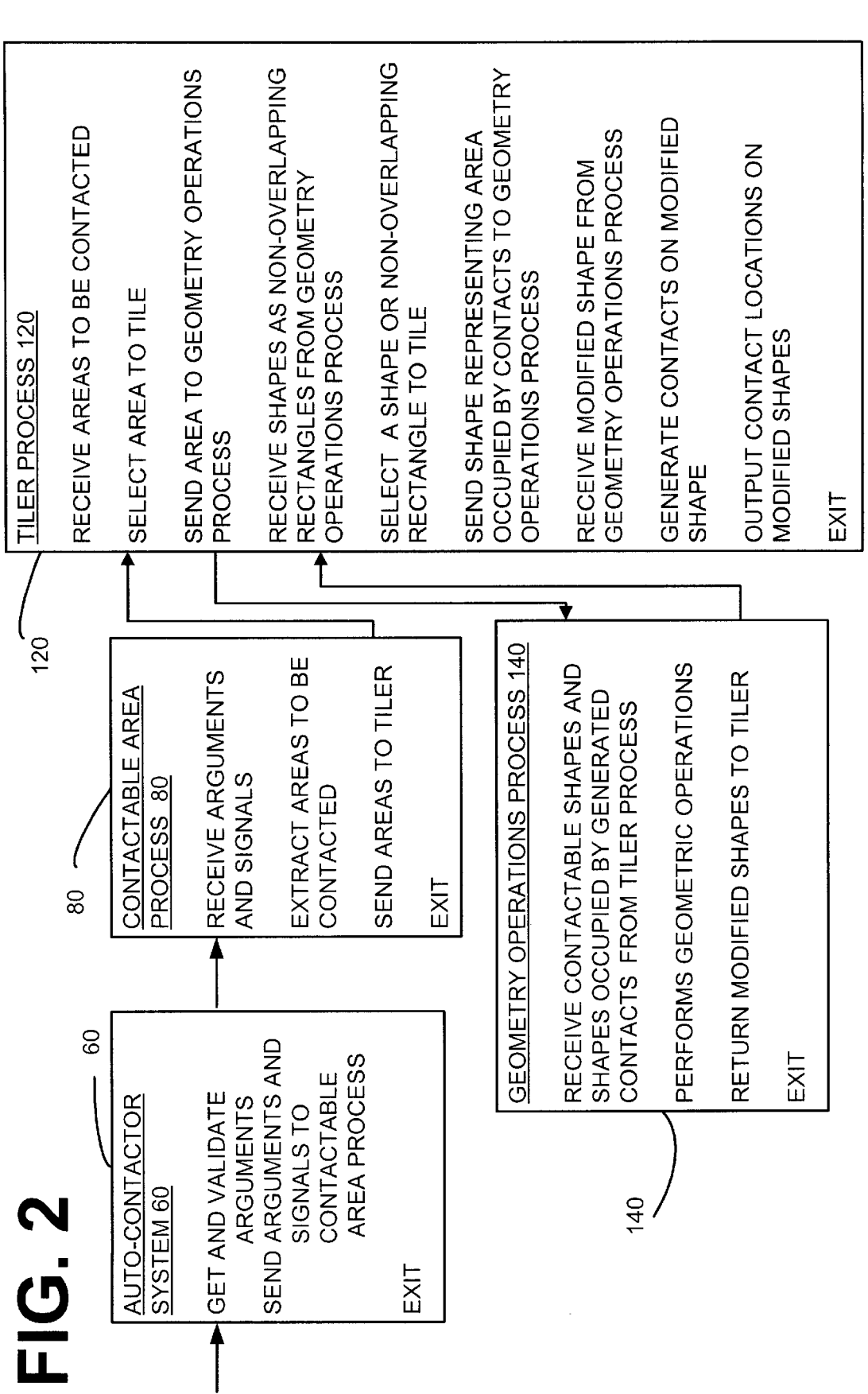

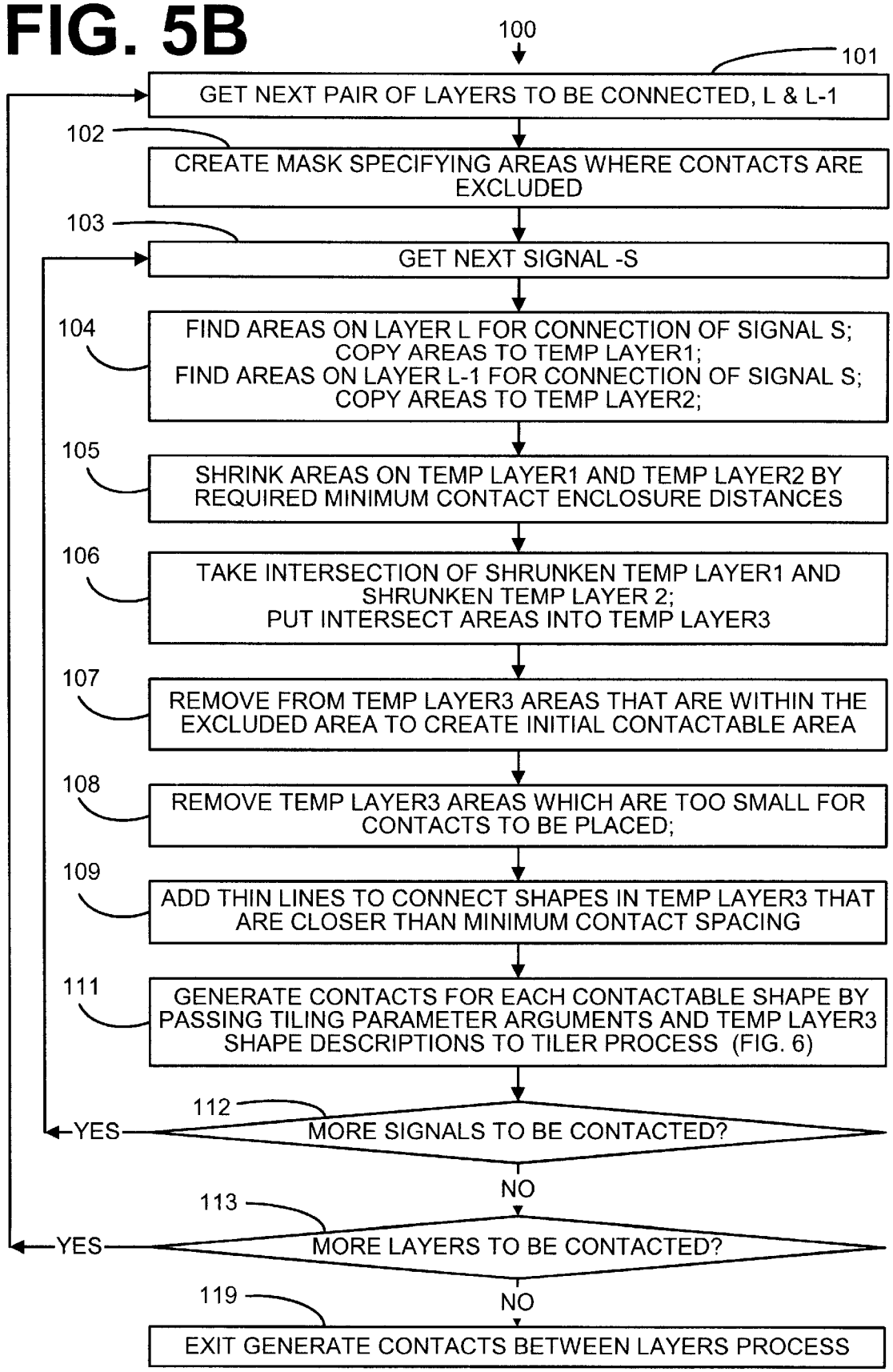

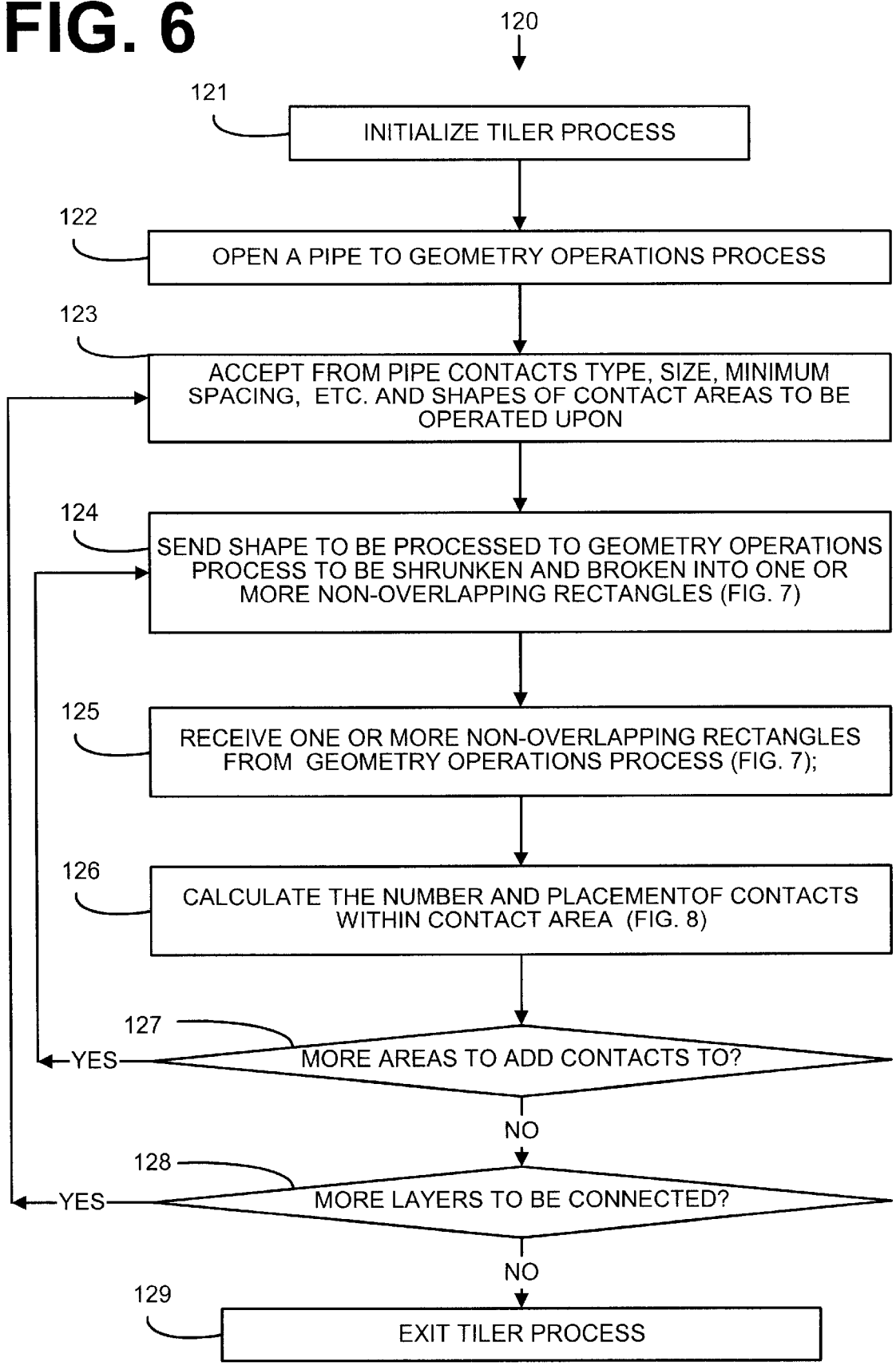

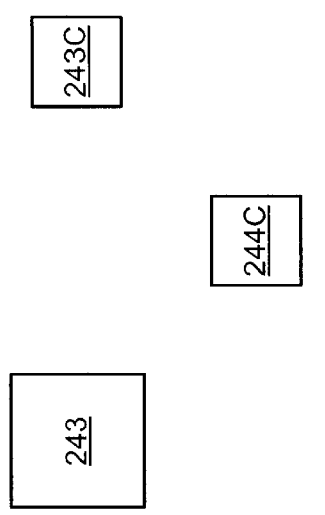
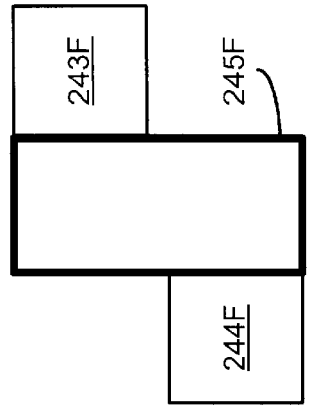
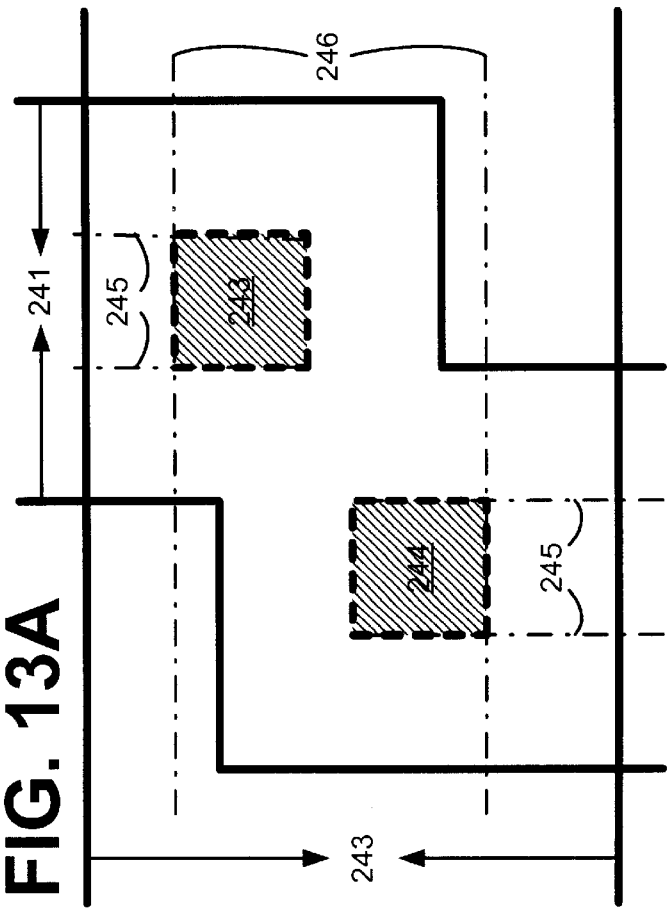
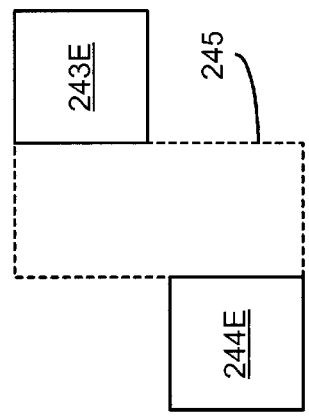
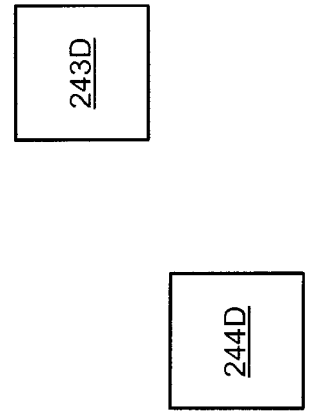

AUTO-CONTACTOR SYSTEM AND METHOD FOR GENERATING VARIABLE SIZE CONTACTS

BACKGROUND OF THE INVENTION

1. Field of the Invention

This invention generally relates to the placement of contacts for signal lines between layers on an integrated circuit, and more particularly, to an auto-contactor system and method for automatically placing variable size contacts (a.k.a. "vias") between same named signals on different layers of an integrated circuit chip automatically.

2. Discussion of the Related Art

Integrated circuits (IC) are electrical circuits comprised of transistors, resistors, capacitors, and other components on a single semiconductor "chip". These components are interconnected to perform a given function such as a microprocessor, programmable logic device (PLD), electrically erasable programmable memory (EEPROM), random access memory (RAM), operational amplifier, or voltage regulator. Very large scale integration (VLSI) technology is often utilized to create semiconductor integrated circuits comprising thousands of logic elements and signal lines. VLSI circuits are fabricated on silicon, gallium-arsenide or germanium wafer (i.e., substrate) and typically include signal lines and logic structures.

The logic element structures control the signal processing and comprise irregular elements, such as gates, latches, memory arrays or multipliers. These logic structures are built up on an integrated circuit into multiple layers. In order for each of these logic elements to perform they need inputs and outputs. These inputs and outputs are usually signal lines from other logic elements. These signal lines typically run horizontally on a layer or vertically through a layer. The signal lines that run horizontally in a layer also are typically run orthogonally on one side of the layer as compared to the opposite side of the layer. For example, this means that in adjacent pair of layers the upper layer the signal lines run in one direction, such as in north-south, and then on the lower layer the signal lines would be perpendicular and run east-west. The conductors carry control signals, data signals, clock signals, power (such as VDD) and ground. A hole is created in the insulating material between layers to get these power, ground and signal lines from one layer or another. A contact is then placed in the hole so as to connect conductors on adjacent layers. This allows VDD, ground and data signals to be routed wherever needed on a chip.

The lines for VDD and ground are typically wide lines to reduce resistance. However, the contacts between layers are generally of fixed size. These contacts have a high resistance compared to the conductive lines. That being the case, one typically places multiple fixed size contacts to connect conductors between adjacent layers. It is desirable to have numerous contacts for these power lines in order to minimize resistance.

In general, with regard to generating the design of the VLSI circuits, net lists are generated by various means including extraction from schematics and "artwork" (detailed layouts of components and connecting conductors and contacts). The net list is a listing of all the logic elements and the connectivity of the logic elements that comprise a block of logic. The net list is fed into a placement and routing tool, which generates the layout of the VLSI circuits therefrom. The resulting layout designates the actual position and wiring of each logic element of the VLSI circuits. The degree to which the placement of each component is optimized is a function of the design criteria of the placement and routing algorithm implemented by the placement and routing tool and the amount of central processing unit (CPU) time devoted to the operation of the placement and routing tool.

These algorithms are designed to minimize the routing resistance and capacitance in the VLSI circuits by minimizing the routing lengths between connections. If the routing lengths are minimized, then the routing capacitive load is minimized, and the VLSI circuits is faster, smaller (i.e., denser), and consumes less power, all of which are desirable attributes. Most conventional placement and routing algorithms achieve this optimization via an iterative, pseudo-random placement scheme. After an initial placement of the components, each component is considered for a move to see if the design can be better optimized by the move. The type of moves considered are usually either (1) swapping the position of a component with another randomly selected component, or (2) moving the position of a component to a randomly selected new location. The determination of whether or not the design can be optimized by the move is based upon a cost function. For example, the cost function may be the total wire length of the design, whereby the lower the total wire length, the more optimized the design.

A calculation is done by the algorithm for each move to determine the change in the cost function caused by the proposed move. If the change is negative, thereby generating a new lower cost function, then the move is accepted and used as a new placement for the component under consideration for further iterations of the algorithm. Selecting only negative cost function changes is called a "greedy" algorithm.

A more advanced placement and routing algorithm, referred to as "simulated annealing", will occasionally accept moves producing a positive change in the cost function. In such cases, the simulated annealing algorithm will either accept or refuse the proposed move based upon the magnitude of a positive change, a decreasing value called the "temperature", and a random number so that the selection of the move is a probabilistic selection. Thus, a simulated annealing placement and routing algorithm performs design optimization via multiple iterations of a pseudo-random placement scheme modified by a temperature cost function.

While the methods described above and those known in the industry are adequate when placing standard logic elements, such as gates and latches, in the VLSI circuits, they have proven to be inadequate when placing and routing contact elements for wide signal lines between the layers of the IC chip. Simply stated, the current methods known in the industry do not automatically generate contacts between same name signals on different layers of an integrated circuit in an efficient manner. The current methods known in the industry do not adjust the contact density according to the size and shape of the individual areas where contacts from one signal line on one integrated circuit layer can be placed to be in contact with a same name signal line on a different layer while still providing good conductivity between the layers and avoiding the generation of excessive number of contacts which could overwhelm programs which subsequently process the layout data (e.g., DRC, mask generator).

Thus, a heretofore unaddressed need exists in the industry to address the aforementioned deficiencies and inadequacies.

SUMMARY OF THE INVENTION

To achieve the advantages and novel features, the auto-contactor provides a system and method for optimizing the size and placement of contact elements for connecting signal lines from one layer to another. Briefly described, in architecture, the auto-contactor can be implemented as follows. The contact area mechanism identifies a contact area that overlaps the signal line from the first layer of the integrated circuit and the signal line on the second layer of the integrated circuit. The optimizing mechanism calculates an optimal size of a plurality of contacts in the contact area.

The auto-contactor system of the present invention also provides for and can be thought of as a method that optimizes the placement and size of contact elements for connecting a signal line on a first layer of the integrated circuit to a signal line on a second layer of the integrated circuit that comprises the following steps: (1) identifying a contact area that overlaps the signal line from the first layer of the integrated circuit and the second layer of the integrated circuit; and (2) calculating an optimal size of a plurality of contacts in the contact area.

In accordance with another aspect of the auto-contactor system, a computer readable medium is provided having program code for controlling a computer system for generating a design that optimizes the placement and routing of contact elements for connecting wide signal lines for one layer to another. In this implementation, the computer readable medium includes a first code segment configured to identify a contact area that overlaps the signal lines from the first layer of the integrated circuit and the second layer of the integrated circuit; and second code segment configured to calculate an optimal size of a plurality of contacts in the contact area.

Other features and advantages of the auto-contactor system will become apparent to one with ordinary skill in the art upon examination of the following drawings and detailed description. It is intended that all such additional features and advantages be included herein within the scope of the present invention, as defined by the appended claims.

BRIEF DESCRIPTION OF THE DRAWINGS

The auto-contactor system of the present invention can be better understood with reference to the following drawings. The elements of the drawings are not necessarily to scale, emphasis instead is being placed upon clearly illustrating the principles of the present invention. Furthermore, like reference numerals designate corresponding parts throughout the several views.

FIG. 2 is a block diagram illustrating the auto-contactor system, the contactable area process, the tiler process, and the geometry operations process situated within a computer readable medium in a computer system as shown in FIG. 1.

FIG. 5B is a flow chart of the contactable area process that identifies the contactable areas between adjacent layers and sends these identified contactable areas for the specific layer to the tiler process, as shown in FIGS. 1, 2 and 5.

FIG. 6 is a flow chart of the tiler process that determines the number and spacing of the contacts to be placed on each contactable area for a particular IC chip layer, as shown in FIGS. 1, 2 and 3A.

FIGS. 13A–13F are block diagrams illustrating the process of the auto-contactor system of the present invention for contactable areas that turn into multiple shapes when shrunk as illustrated in FIG. 5B.

DETAILED DESCRIPTION OF THE PREFERRED EMBODIMENT

The following description is of the best presently contemplated mode of carrying out the auto-contactor system of the present invention. This description is not to be taken in a limiting sense, but is made merely for the purpose of describing the general principles of the invention. Further, the auto-contactor system is not to be limited to the particular implementation of the preferred embodiment or to any particular implementation in software, firmware, hardware, or any combination thereof. Instead, the auto-contactor system can be easily implemented in any number of ways, but preferably it is implemented as software stored on a computer readable medium such as an electronic, magnetic, optical, or other physical device. The scope of the invention should be determined by referencing the appended claims.

The auto-contactor system provides an improved integrated circuit design system and method for generating a design (i.e., art work) for contact elements embedded between the layers of the IC chip for connecting signal lines from one layer to an adjacent layer. An advantage of the auto-contactor system is that it provides for a design of contacts that "optimizes" contact elements density and reduces resistance between the layers of an IC chip. The auto-contactor system also provides for a design of contact elements embedded between the layers of an IC chip that indirectly enables the IC chip to operate faster. The determination of the overlapping contact areas from layer to layer are considered to be inefficient and error prone to do manually at best, and at worst humanly incomprehensible in its design.

Accordingly, the following discussion of the auto-contactor system provides an improved system and method for generating an optimized design of contact elements embedded between the layers of the IC chip for connecting signal lines from one layer to another.

Figure 1:
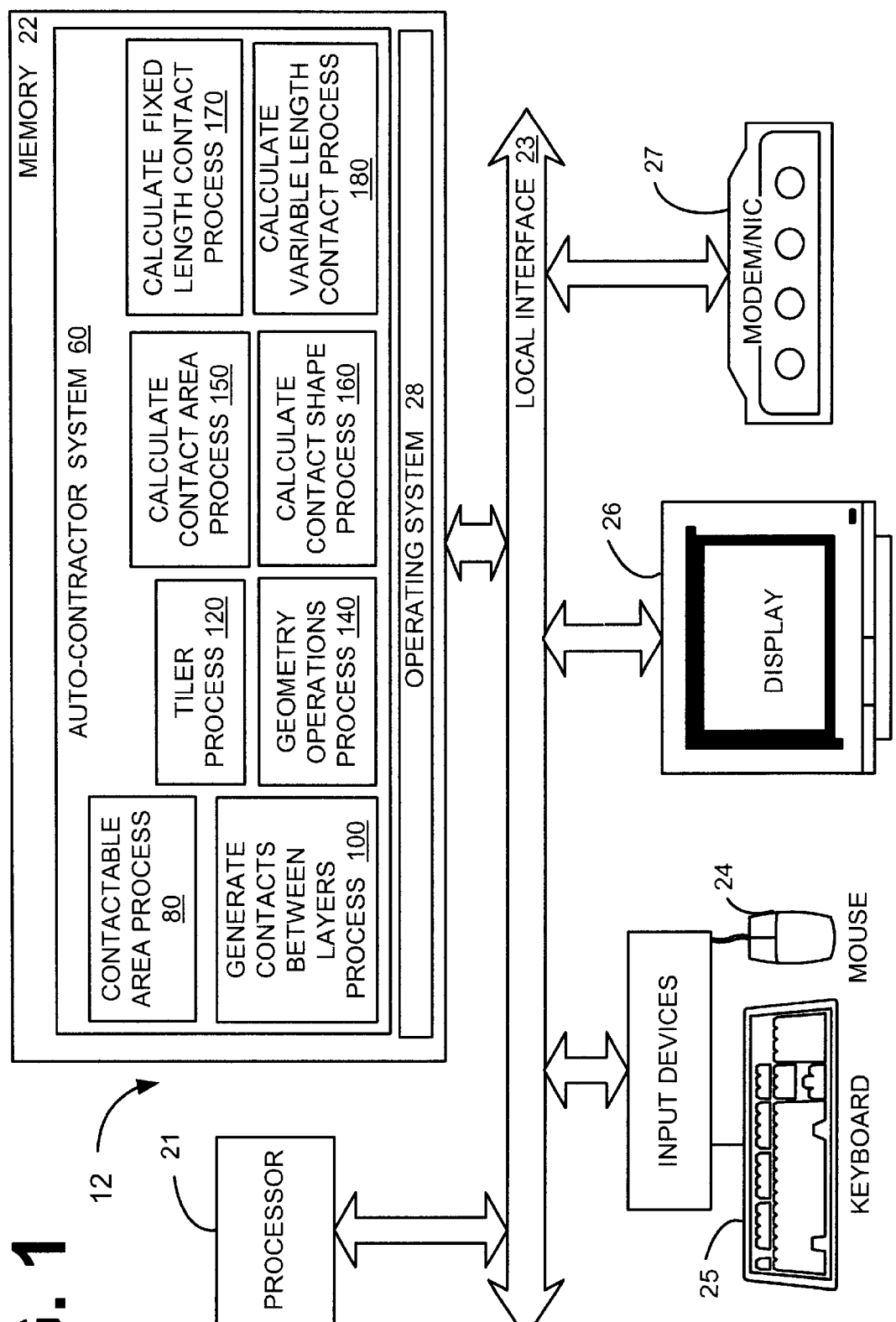
FIG. 1 is a block diagram of a computer system containing the auto-contactor system of the present invention.

As illustrated in FIG. 1, shown is a computer systems 12 generally comprising a processor 21, and a memory 22 with an operating system 28. The processor 21 accepts data from memory 22 over a local interface 23, such as a bus(es). The memory 22 can be either one or a combination of the common types of memory, for example, but not limited to, erasable programmable read only memory (EPROM), electronically erasable programmable read only memory (EEPROM), flash memory, programmable read only memory (PROM), random access memory (RAM), read only memory (ROM), flash memory, dynamic random access memory (DRAM), static random access memory (SRAM), or the like. The memory 22 may also include either one or a combination of nonvolatile memory, such as disk drives, tape drives, CDROM drives, cartridges, cassettes, or memory located on a network server. Direction from the user can be signaled by using the input devices, for example, but not limited to, a mouse 24 and a keyboard 25. The action input and result output may be displayed on a display terminal 26.

Stored in the memory 22 is the auto-contactor system 60 that generates contact elements embedded between the layers of the IC chip for connecting signal lines from one layer to another of the auto-contactor system. The auto-contactor system 60, contactable area process 80, generate contacts between layers process 100, tiler process 120, geometry operations process 140, calculate contact area process 150, calculate contact shape process 160, calculate fixed length contact process 170, and calculate variable length contact process 180 can be implemented in hardware, software, firmware, or a combination thereof. In the preferred embodiment(s), the auto-contactor system 60, contactable area process 80, tiler process 120, geometry operations process 140, calculate contact area process 150, calculate contact shape process 160, calculate fixed length contact process 170, and calculate variable length contact process 180 are implemented in software or firmware that is stored in a memory 22 and that is executed by a suitable instruction execution system.

Illustrated in FIG. 2 is a block diagram of the auto-contactor system 60 and its interaction with its sub-processes the contactable area process 80, the tiler process 120 and geometry operations process 140. First, the auto-contactor system 60 is initialized and that initialization gets and validates supplied arguments. The auto-contactor system 60 sends the argument and signals to the contactable area process 80 for further processing.

The contactable area process 80 receives the arguments and signals from the auto-contactor system 60. The contactable area process 80 then extracts the areas to be contacted, i.e., the areas in which contacts will be placed between layers to conduct a signal from one IC circuit layer to an adjacent IC circuit layer. These contactable areas are then sent to the tiler process 120.

The tiler process 120 receives the areas to be contacted. The tiler process 120 then selects a specific area to be contacted (or tiled). The tiler process 120 sends the area to the geometry operations process to shrink the given shape and to return the shrunken shape as one or more non-overlapping rectangles. The tiler process 120 receives the contactable shapes in the form of non-overlapping rectangles from the geometric operations process and selects one of the non-overlapping rectangles from the geometric operations process to be tiled with contacts. A rectangle representing the area occupied by the just-generated contacts and including some space surrounding the contacts is sent to the geometric operation process for determining what areas (if any) remain to be tiled with contacts. The tiler process 120 then receives the modified shape from the geometric operations process 140 and generates the contacts for the modified shape area. These contact shapes are output to a file or displayed to the user. After processing all shapes in this manner, the tiler process 120 then exits.

The geometric operations process 140 processes contactable shapes one at a time. The geometric operations process 140 receives a contactable shape, then performs the various geometric operations of contracting, subtracting areas in which contacts have been generated, and returning the modified shapes to the tiler process in the form of non-overlapping rectangles.

Figure 3A:
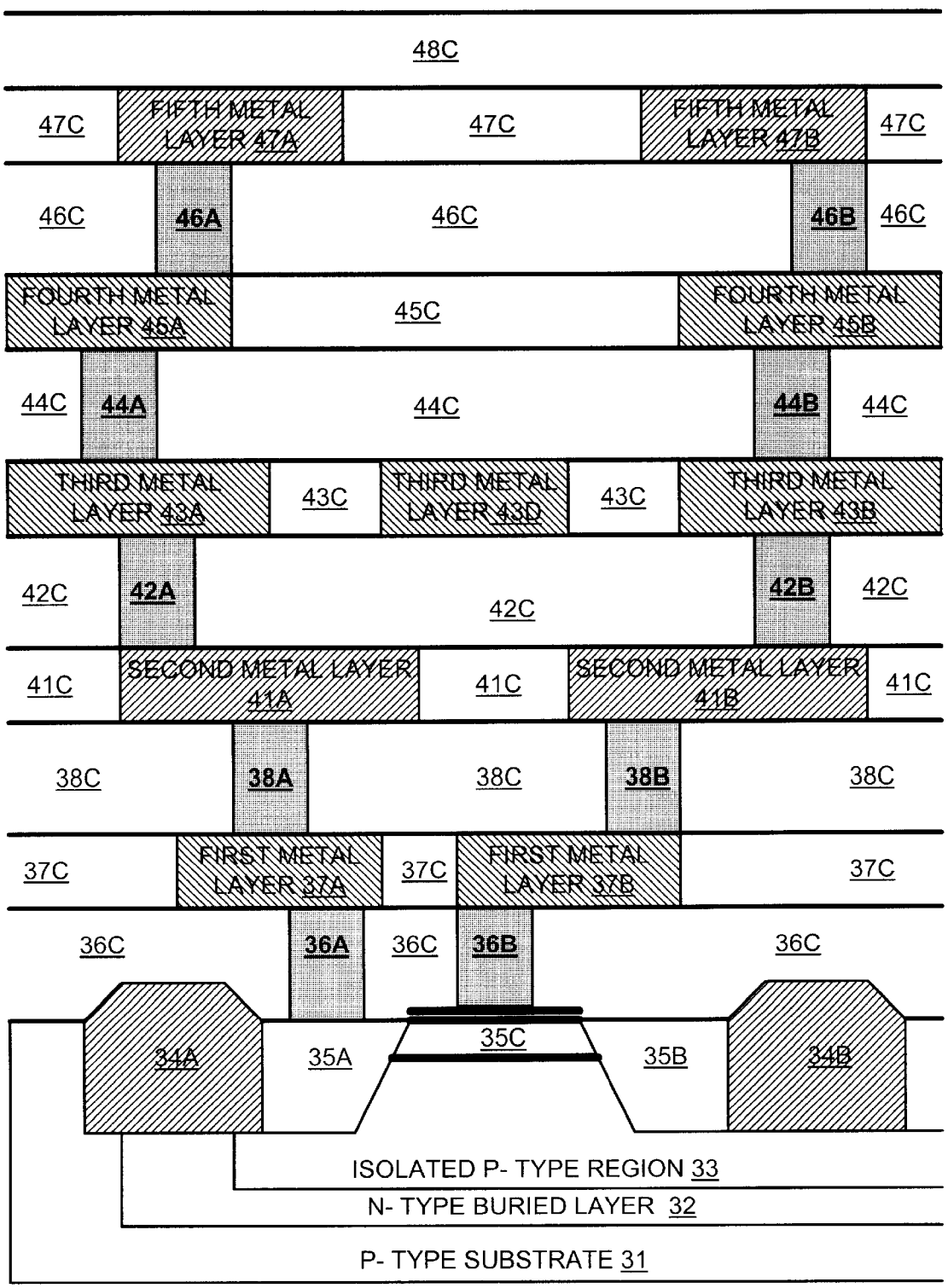
FIG. 3A is a block diagram showing a side view of an example IC chip that illustrates the alternating metal and contact layers on the surface of the IC chip with signal lines connected to a sample.

Illustrated in FIG. 3A is a side view of an example of the alternating metal lines and connecting contacts embedded in insulating material to a transistor and connected at the bottom in an integrated circuit. The integrated circuit can be made up of a two-type substrate 31 with an N-type buried layer 32 deposited on the P-type substrate 31. On top of the N-type buried layer 32 an isolated P-type region 33 is deposited and connected to regions 35A through 35C, which construct the actual transistor. The transistors illustrated by item 35A through 35C are connected to the surrounding IC layer via connection block 34A and 34B. Also connected to the transistor 35A through 35C are the connectors 36A and 36B, that connect electrical signals on transistor 35A through 35C to the first metal layer 37. These connectors 36A and 36B, respectively, are surrounded by an insulating material 36C to prevent signal crossover and voltage drain between the contacts through the layer material. The first metal layer 37 has a metal layer 37A connected to contact 36A and metal layer 37B connected to contact 36B. These first metal layer signals 37A and 37B respectively are utilized to distribute the signals from the transistor 35A through 35C on the substrate base to other areas on the integrated circuit. The signals were transmitted through additional contacts through the insulating layer and distributed using other metal layers such as second metal layer 41 (A and B), third metal layers 43 (A, B and D), fourth metal layers 45 (A and B), and fifth metal layers 37 (A and B).

As can be seen in FIG. 3A, the signals are transmitted and distributed across the IC chip through metal contacts that are deposited on the previous layer of the integrated circuit. All the metal layers and insulating layers of the integrated circuit are then covered with a final insulating layer 48C. While it is shown only as an example in FIG. 3A that the integrated circuit has five metal layers for transmitting signals, it should be apparent to those skilled in the art that there can be numerous numbers of metal contact layers deposited on top of an IC chip to transmit signals throughout the entire integrated circuit.

Figure 3B:
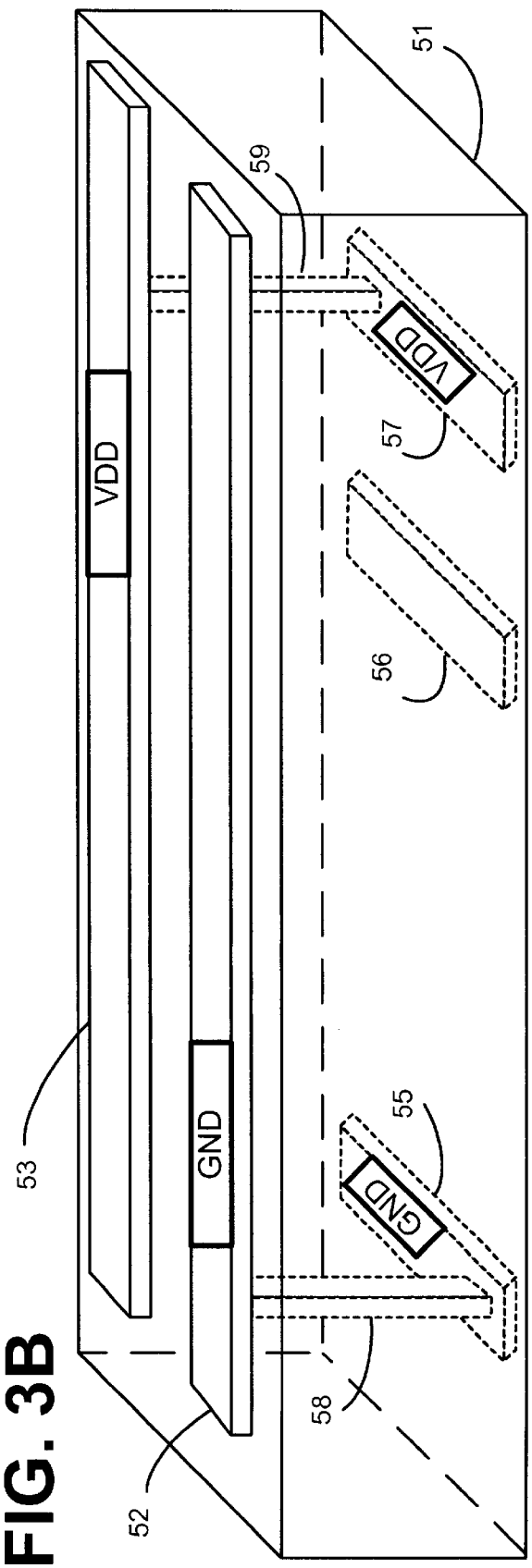
FIGS. 3B and 3C are block diagrams of a perspective view and side view of the example IC chip in FIG. 2, that illustrates the signal lines within the adjacent layers, and along with the contacts connecting the layers.
Figure 3C:
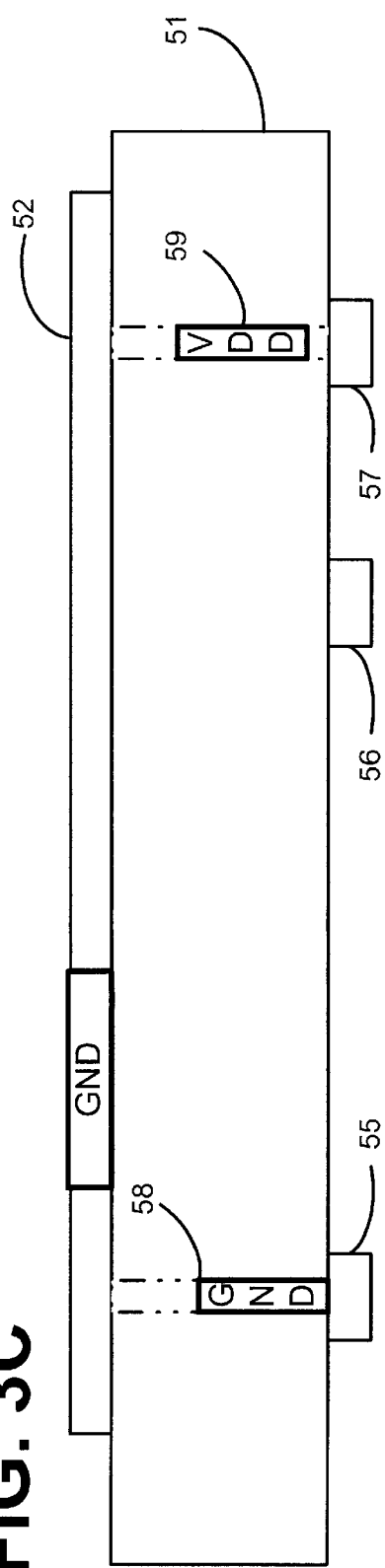

Illustrated in FIGS. 3B and 3C are perspective and side views of the VDD and ground lines on an adjacent IC layer with the contacts from connecting one metal layer to another on the opposite side of the contact layer.

As can be seen in the perspective view of FIG. 3B, the example of one IC contact which has lines running in one direction in layer 50 and in a perpendicular direction in layer 51. Contact 58 connecting GND lines 52 to 55 and contact 59 connecting VDD lines 53 to 57. This illustrates the concept of where the signal line runs perpendicular on one side of the layer to the side opposite side of the layer. Ground line 52 and VDD line 53 on the top of layer 51 run horizontally on the layer 51. Ground signal line 55, VDD line 57, and signal line 56 runs perpendicular to lines 52 and 53, respectively. It is in this way that the signal lines transmit the signal from one side of the layer to the side opposite of the layer through layer contacts 58 and 59.

FIG. 3C shows a side view of the one example IC chip layer 51. The ground line 52 resting on top of the layer 51 runs perpendicularly to the ground line 55, VDD line 57, and signal line 56. Again, as can be seen in FIG. 3C, the ground contact 58 and the VDD contact 59 provide an electrical connection between same name signal lines from one side of an IC chip layer to the side opposite side of a chip layer.

Figure 4:
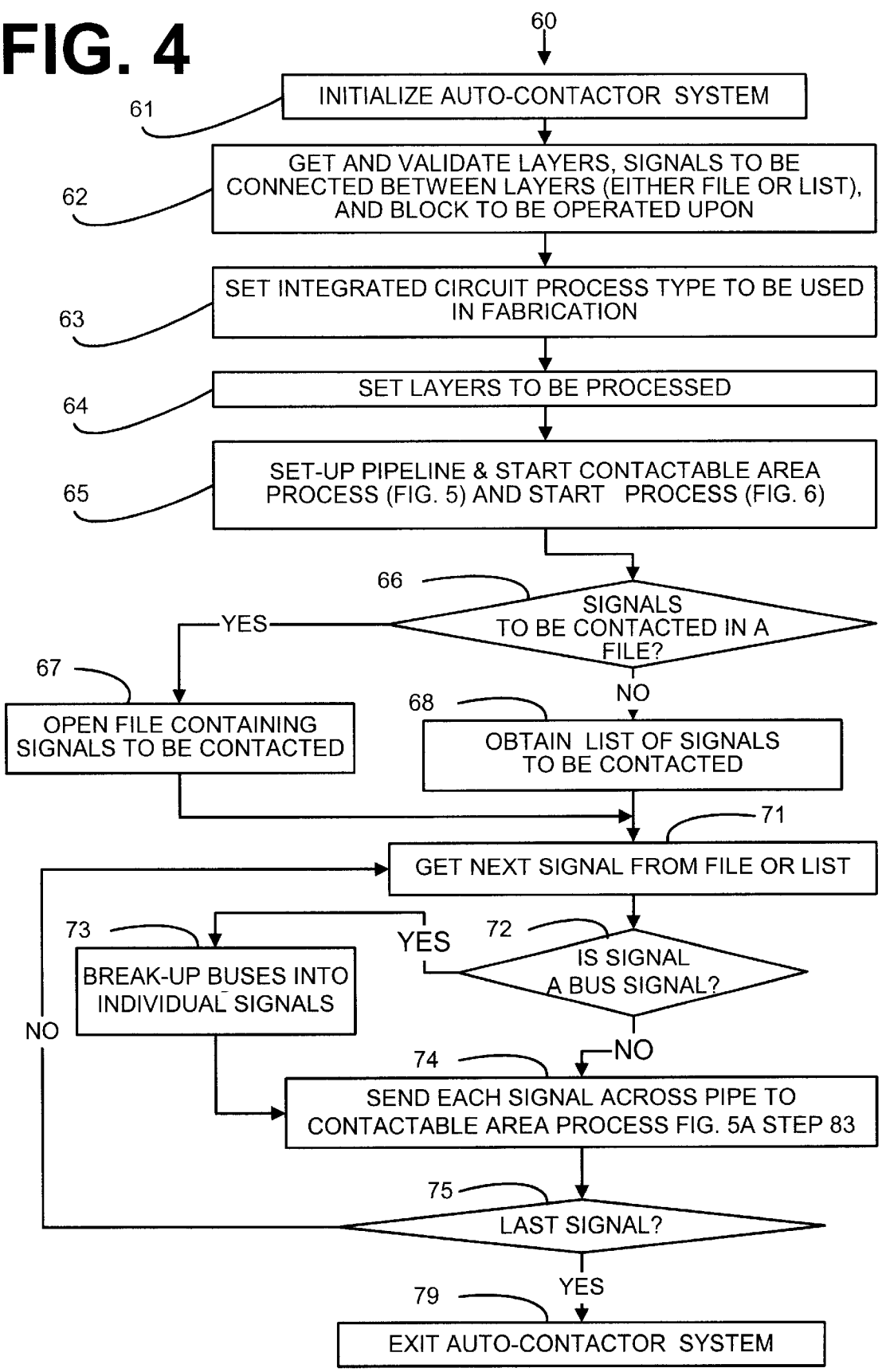
FIG. 4 is a flow chart of the operation of the auto-contactor system in accordance with the present invention, shown in FIGS. 1 and 2.

Illustrated in FIG. 4 is the flow diagram of the architecture and process of the auto-contactor system 60 implemented by the computer system 12. The auto-contactor system 60 is initialized at step 61. The auto-contactor system 60 then receives and validates data input regarding the layer(s) to be contacted through, the signal(s) to be connected between each side of the layer to be contacted, and the block to be operated upon. A block is a design unit, in this case a collection of conductors with physical location information and signal name information (e.g., an ALU).

Next, the auto-contactor system 60 sets the integrated circuit process type to be used in the fabrication at step 63. This can be obtained either from user input or environment variable, or from a system default. In step 64, the auto-contactor system 60 obtains the layers to be contacted. The auto-contactor system 60 sets the metal and contact layer (L) and opposite; metal layer (L−1) to be processed by the auto-contactor system 60. At step 65, the auto-contactor system 60 then sets up a pipeline and starts the contactable area process FIG. 5A and tiler process FIG. 6.

At step 66, the auto contactor system 60 next determines if the signals to be contacted are contained within a file. If so, then at step 67 the auto contactor system 60 opens the file containing the signals to be contacted. Otherwise, if the signals to be contacted are not in a file, then at step 68 the auto-contactor system 60 obtains a list containing the signals to be contacted from the argument list or a default list (which is VDD and GND). Next, at step 71, the auto-contactor system 60 gets the next signal from either the opened file or the opened list.

At step 72, the auto-contactor system 60 determines if the signal to be processed is a bus signal. If the signal to be processed is specified in bus notation (indicating a range of signals) at step 73, the auto-contactor system 60 breaks up the bus into individual signals. Regardless of whether the signal line is a bus signal or not, at step 74, the auto-contactor system 60 sends each signal across the pipe established at step 65 to be processed by the contactable area process 80. The contactable area process 80 is herein defined in further detail with regard to FIG. 5.

At step 75, the auto-contactor system 60 determines if the signal sent across the pipe was the last signal in either the open file or the list of signals. If there are more signals to be processed in either the open file or the list, the auto-contactor system 60 returns to step 71 to get the next signal from the open file or list. If the signal sent across the pipe at step 74 is the last signal, in either the open file or list, the auto-contactor system 60 exits at step 79.

Figure 5A:
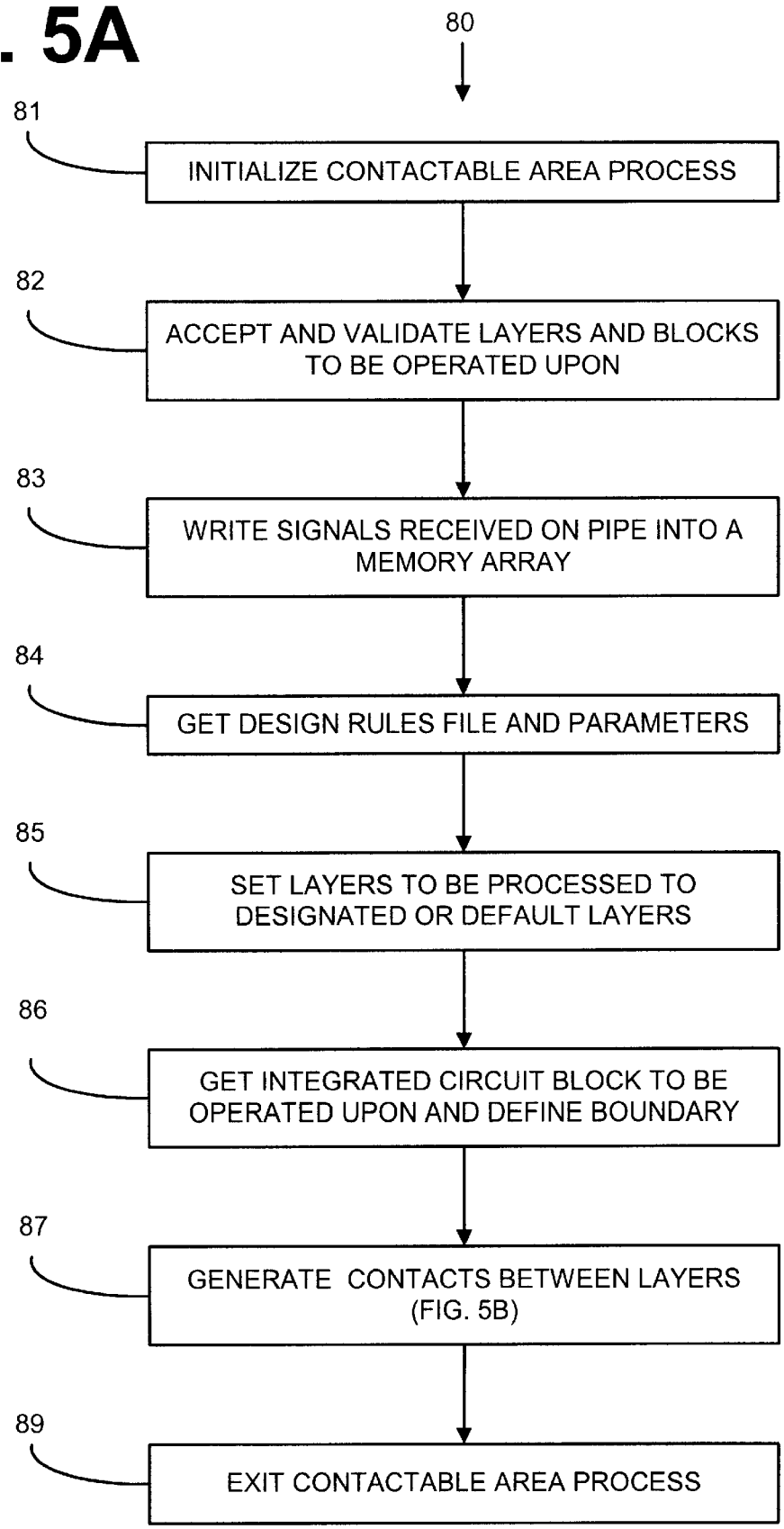
FIG. 5A is a flow chart of the contactable area process that does the initial extraction of the areas to be contacted and then transmits the shapes to be contacted to the tiler process, as shown in shown in FIGS. 1 and 2.

Illustrated in FIGS. 5A and 5B is the flow diagram for the contactable area process 80. First, at step 81, the contactable area process 80 is initialized. Next, at step 82, the contactable area process accepts and validates the layers and block to be operated on. At step 83, The contactable area process 80 writes the signals received from the pipe into a memory array. This memory array can be configured as a queue, a stack, or any other type of data structure that allows data to be retrieved one element at a time. At step 84, the contactable area process 80 obtains the design rules file and parameters.

At step 85, the design rules in the file and the parameters define the contact related parameters of the semiconductor fabrication process to be factored into the determination of the contact placement and size. At step 86, the contactable area process 80 gets the integrated circuit block to be operated upon and determines the boundary of the block. In this methodology, the artwork designer creates the block boundary. The to designer is allowed to draw metal layers near or outside the boundary, but the auto-contactor system 60 will avoid placing contacts near or outside the boundary. At step 87, the contactable area process 80 generates the contacts between pairs of signal lines surrounding a layer. This process to generate contacts between pairs of like-named signal lines on adjacent layers is herein defined in further detail with regard to FIG. 5B. At step 89, the contactable area process 80 then exits.

Illustrated in FIG. 5B is the flow diagram of the process that generates the contacts between pairs of signal lines surrounding a layer, within the contactable area process 80. This process is hereafter referred to as generate contacts between layers process 100. The generate contacts between layers process 100 processes adjacent layers of metal in order to determine the specific areas in which contacts can be placed, as referenced at step 87 in FIG. 5A. First, at step 101, the generate contacts between layers process 100 gets the next pairs to be connected L and L−1. At step 102, the contactable area process 80 creates a mask specifying the areas where contacts are excluded.

The contactable area process 80 retrieves the next signal-S to be processed at step 103. The contactable area process 80 finds the metal shapes in layer L intended for connection of signal S and copies those shapes to a temp layer 1 previously defined. Next, the contactable area process 80 finds the areas on the layer below layer L (labeled L–1) for connections of signal-S and copies these areas to a temp layer 2 data area at step 104.

Next, at step 105, the areas copied to temp layer 1 and temp layer 2 are shrunk by the minimum contact enclosure distances. Then, at step 106, the contactable area process 80 takes the shrunken temp layer 1 and shrunken area temp layer 2 and finds the intersection between these areas, placing the intersection shapes into a temp layer 3. At step 107, the contactable area process 80 removes from temp layer 3 those areas that are within the excluded area defined by the excluded contact mask area created at step 102. Next, at step 108, the contactable area process 80 removes from the temp layer 3 data area those areas which are too small for contacts to be placed, as illustrated in FIGS. 12B, 12C, and 12D, and at step 109 which adds thin lines to connect shapes in the temp layer 3 data area that are closer than the minimum contacts spacing, as illustrated in FIGS. 13E and 13F. The added of the rectangle connecting contactable areas 243E and 244E (FIG. 13E) ensures that these shapes these shapes are processed together to avoid placing contact too close to one another.

Then, at step 111, the contactable area process 80 calls the tiler process 120 to generate contacts for each of the contactable shapes in temp layer 3. The tiler process 120 is herein defined in further detail with regard to FIG. 6. The contactable area process 80 passes to the tiler process 120 the tiling parameter arguments and the temp layer 3 data area shape descriptions with the call.

At step 112, after the processing returns from the tiler process 120 to the contactable area process 80, the contactable area process 80 determines if there are more signals to be contacted. If there are more signals to be contacted, the contactable area process 80 returns to repeat steps 103 through 112. If there are no more signals to be contacted, then the contactable area process 80 then determines if there are more layers to be contacted.

If there are more layers to be contacted, the contactable area process 80 returns to step 101 to get the next pair of layers to be contacted, and repeat steps 101 though 113. If there are no more layers to be contacted, the contactable area process 80 exits at step 119.

Illustrated in FIG. 6 is the tiler process 120. At step 121, the tiler process 120 is initialized. At step 122, a pipe to a geometry operations process is opened. Next, at step 123, the tiler process 120 accepts from a pipe data concerning contact type, size of the contacts, minimum spacing; requirements of contacts and other input parameters, as well as the shapes of the contact areas to be operated upon. At step 124, the tiler process 120 then sends the shape of a contact area to be processed to the geometry operations process 140 so that the shape of the contact area may be shrunken and broken up into one or more non-overlapping rectangles. The geometry operations process 140 is herein defined in further detail with regard to FIG. 7.

After the geometry operations process 140 has shrunken and segmented the contact area shape into one or more non-overlapping rectangles, the tiler process 120, at step 125, receives these one or more non-overlapping rectangles from the geometry operations process 140.

At step 126, the tiler process 120 calculates the number and placement of contacts within the contactable area. The process to calculate the number and placement of contacts within the contactable area is herein defined in further detail with regard to FIG. 8.

If there are no more non-overlapping rectangular areas to have contacts added to within the shape, the tiler process 120 then proceeds to step 127 to determine if there are more shapes to have contacts added to. If there are more shapes to have contacts added to, the tiler operations 120 process returns to step 124 to repeat steps 124 through 127. If there are no more shapes to add contacts to, the tiler process 120 at step 128 determines if there are more layers to be connected. if so, parameters and shapes for the tiler 120 returns to step 123 to get the next pair of layers to be contacted, and repeat steps 123 though 128. If there are no more layers to be contacted, the tiler process 120 exits at step 129.

Figure 7:
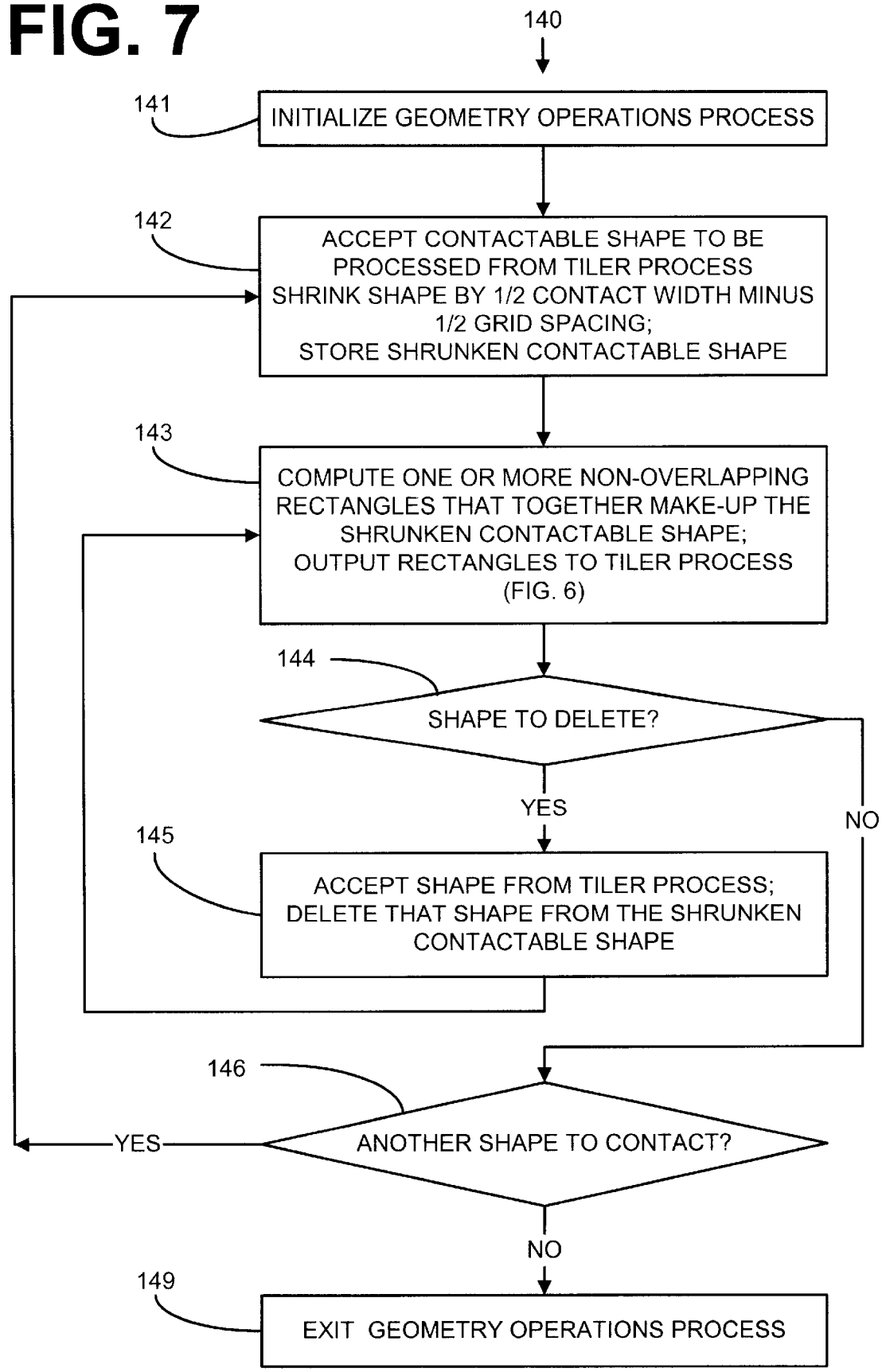
FIG. 7 is the flow chart of the geometric operations process that computes the actual contact area to be utilized for the addition of contacts from a signal line on one layer to the same name signal line on an adjacent layer, as shown in FIGS. 1, 2 and 3A.

Illustrated in FIG. 7 is a flow diagram of the geometry operations process 140. At step 141, The geometry operations process 140 is initialized. At step 142, the geometry operations process accepts a contactable shape to be processed from a pipe established at step 122 (FIG. 6) by the tiler process 120. At step 142, the geometry operations process 140 then shrinks the shape by approximately one-half the contact with minus one-half of the grid spacing, and stores the shrunken shape in the shape remaining data area. This shrinking of the shape by one-half the contact with minus one-half the grid spacing is herein illustrated with regard to FIGS. 13C and 13D.

All artwork input to the auto-contactor system 60 will have dimensions and coordinates which are integer multiples of the grid size. For example, for a given IC process, the grid size may be .1 micron, in which case the contact size for one layer might be 0.6 microns (6 times the grid size) for one contact layer and 0.8 microns for another contact layer. The edge of a contact or of a metal line might have an X or Y coordinate of 123.4 (an integer multiple of the grid size). Although the artwork input is constrained to the grid, temporary shapes generated by the auto-contactor system 60 for internal use need not conform to the grid—thus the shrunken contactable area is not on-grid.

Next, at step 143, the geometry operations process 140 computes one or more non-overlapping rectangles that together make up the shape remaining and outputs the rectangles to the tiler process 120. At step 144, the geometry operations process 140 determines if there is a shape to be deleted from the shape remaining such as, for example, an exclusion zone. If there is a shape to be deleted from the shape remaining, the geometry operations process 140, at step 145, accepts the shape from the tiler process 120 and deletes that shape from the shape remaining. The geometry operations process 140 then returns to step 43 to repeat steps 143–145. Exclusion zones are herein defined in further detail with regard to FIGS. 10A–10D.

If the geometry operations process 140 determines that there is no new shape to be deleted from the shape remaining, the geometry operations process 140 next determines if there is another shape to be processed for contacts at step 146. If there are shapes remaining to be processed for contacts, the geometry operations process 140 returns to step 142 for continued processing. If there are no more shapes to be processed for contacts, the geometry operations process 140 exits at step 149.

Figure 8:
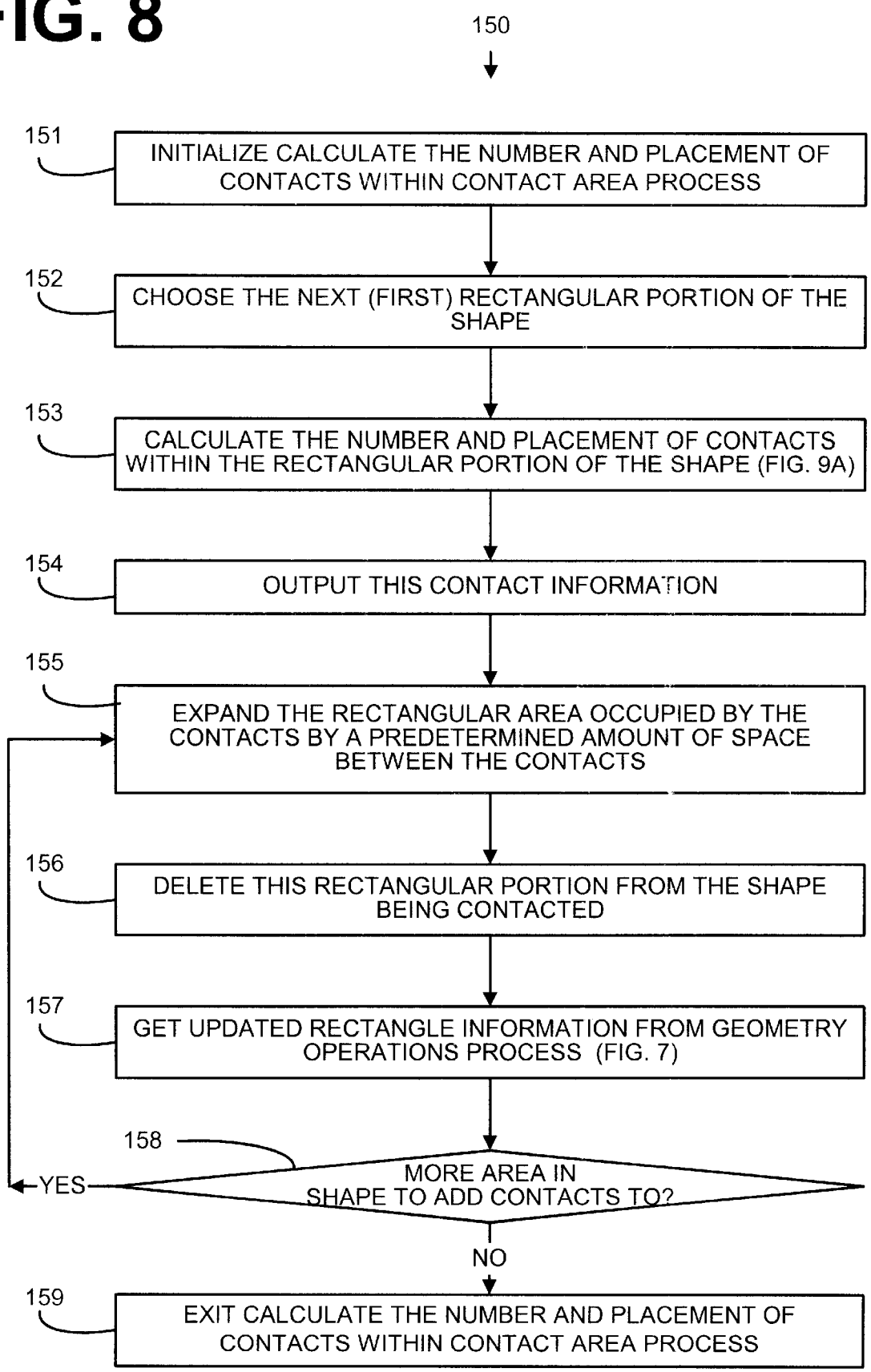
FIG. 8 is the flow chart of the calculate contact area process that computes the number contact and placement of contacts in the contact area of the present, as shown in FIGS. 1 and 6.

Illustrated in FIG. 8 is the process 150 that calculates the number and placement of contacts within the contact area. This process is hereafter referred to as calculate contact area process 150. First the calculate contact area process 150 initializes itself at step 151. At step 152, the calculate contact area process 150 chooses the first or next rectangular to portion of the shape. Next to step 153, the number and placement of contacts within the rectangular portion of the shape are computed. The process that calculates the number and placement of contacts within the rectangular portion of the shape is herein defined in further detail with regard to FIG. 9A.

After the number and placement of contacts within the rectangular portion of the shape are computed, the calculate contact area process 150 outputs this contact information at step 154. Next the rectangular area occupied by the contacts is expanded by predetermined amount of space between the contacts at step 155. This is done to remove the contacted area plus ½ contact space surrounding them from the shapes. This removes the current contacted shape from consideration for more contacts and removes sufficient area around these contacts to insure that no contacts will be placed too close to these contacts.

At step 156 this expanded rectangular portion is deleted from the shape being contacted. The calculate contact area process 150 in gets updated rectangular information from the geometry operations process 140 (FIG. 7). After updating the rectangular information to be contacted, the calculate contact area process 150 determines if there's more area for contacts to be added at step 158. If there is more area in the shape to add contacts, the calculate contact area process 150 returns to repeat steps 155 through 158. If there is no more area in the shape to add contacts, the calculate contact area process 150 then exits at step 159.

Figure 9A:
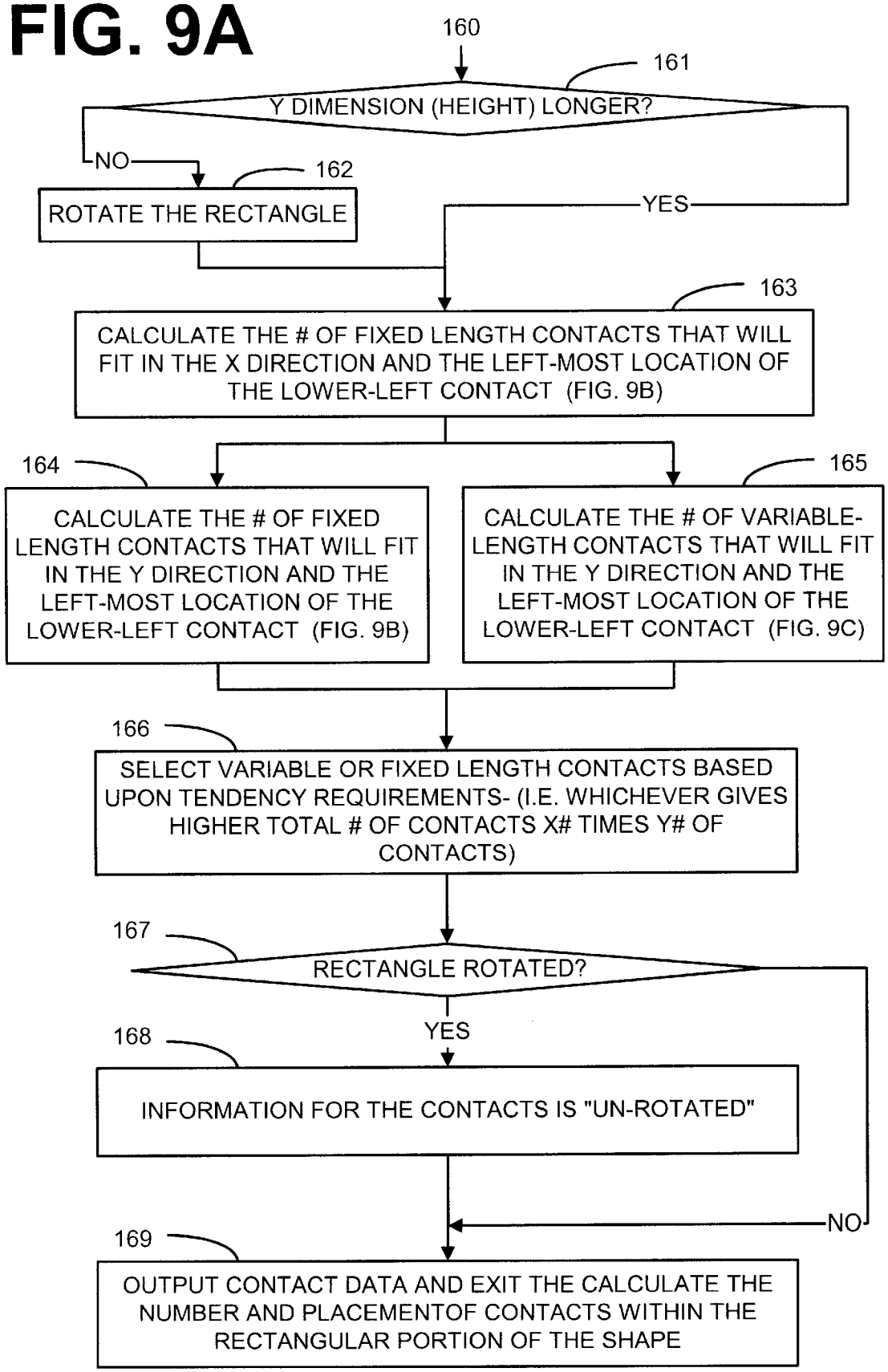
FIG. 9A is the flow chart of the calculate contact shape process that computes the number contact and placement of contacts within the rectangular portion of the shapes, as shown in FIGS. 1 and 8.

Illustrated in FIG. 9A is the process that calculates the number and placement of contacts within a rectangular portion of the shape. This process is hereafter referred to as calculate contact shape process 160. First, at step 161, the calculate contact shape process 160 determines if the Y dimension of the rectangular portion is longer than the X dimension of the rectangular portion. If it is determined that the Y dimension of the rectangular portion is longer than X dimension of the rectangular portion, the calculate contact shape process 160 then proceeds to step 163. If it is determined that the Y dimension of the rectangular portion is not longer than the X dimension of the rectangular portion, the calculate contact shape process 160 then rotates the rectangular portion to be contacted at step 162.

At step 163, the calculate contact shape process 160 sets the X direction to be calculated and executes the process to calculate the number of contacts that will fit in X direction of the rectangular portion. This process also calculates the left most location of the lower left contact. The process to calculate the number of contacts is herein defined in further detail with regard to FIG. 9B.

Figure 9B:
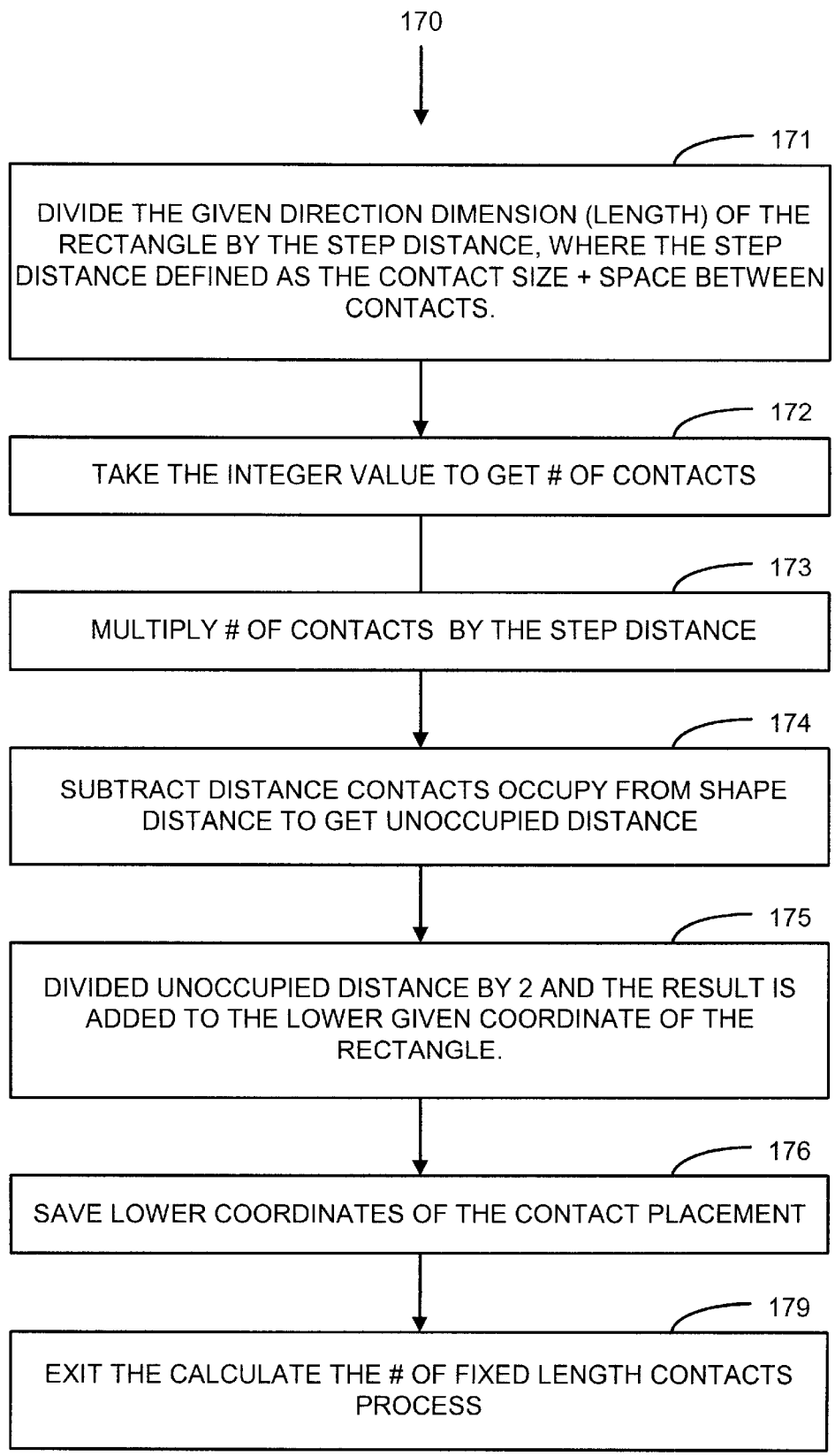
FIG. 9B is the flow chart of the calculate fixed length contacts process that calculates the number of fixed length contacts, as shown in FIGS. 1 and 9A.

After calculating the number of contacts in that will fit in the X direction, the calculate contact shape process 160 then sets the Y direction to be calculated and executes the process to calculate the number of fixed length contacts that will fit in the Y direction at step 164 (FIG. 9B). This process also calculates the left most location of the lower left contact. The calculate contact shape process 160 also calculates the number of variable link contacts that will fit in the Y direction at step 165. The process to calculate the number of variable length contacts is herein defined in further detail with regard to FIG. 9C. This process also calculates the left most location of the lower left contact.

After computing the number of contacts that will fit in the Y direction the calculate contact shape process 160 then selects either the variable or fixed link contacts based on tendency requirements. These tendency requirements had been determined to highly weight whichever Y contact method gives the best electrical quality for the indicated fabrication technology. Next at step 162, the calculate contact shape process 160 determines if the rectangular portion was rotated. If it is determined that the rectangle portion was not rotated at step 162, the calculate contact shape process 160 then outputs the contact data and exits at step 169. If, however, it is determined at step 167 that the rectangle was rotated at step 162, the calculate contact shape process 160 then un-rotates the rectangular portion. The calculate contact shape process 160 then outputs the contact data and exits at step 169.

Illustrated in FIG. 9B is the process that calculates the number and placement of contacts within the given dimension of the rectangular portion of the shape. This process is hereafter referred to as calculate fixed length contacts process 170. First at step 171, the calculate fixed length contacts process 170 divides the given direction dimension of the rectangle portion by a step distance. The step distance is defined as the contact size plus the space between the contacts. Next at step 172, the calculate fixed length contacts process 170 takes the integer value from step 171 to get the number of fixed length contacts. The calculate fixed length contacts process 170 multiplies the number of fixed length contacts by the step distance at step 173. From this value the calculate fixed length contacts process 170 subtract the distance the contacts occupy from the shape distance to get the unoccupied distance at step 174. Next at step 175, the calculate fixed length contacts process 170 divides the unoccupied distance by 2 and the results is added to the lower given coordinate of the rectangle portion. The calculate fixed length contacts process 170 then saves the lower accordance of the contact placement at step 176, and exits the calculate fixed length contacts process 170 at step 179.

Figure 9C:
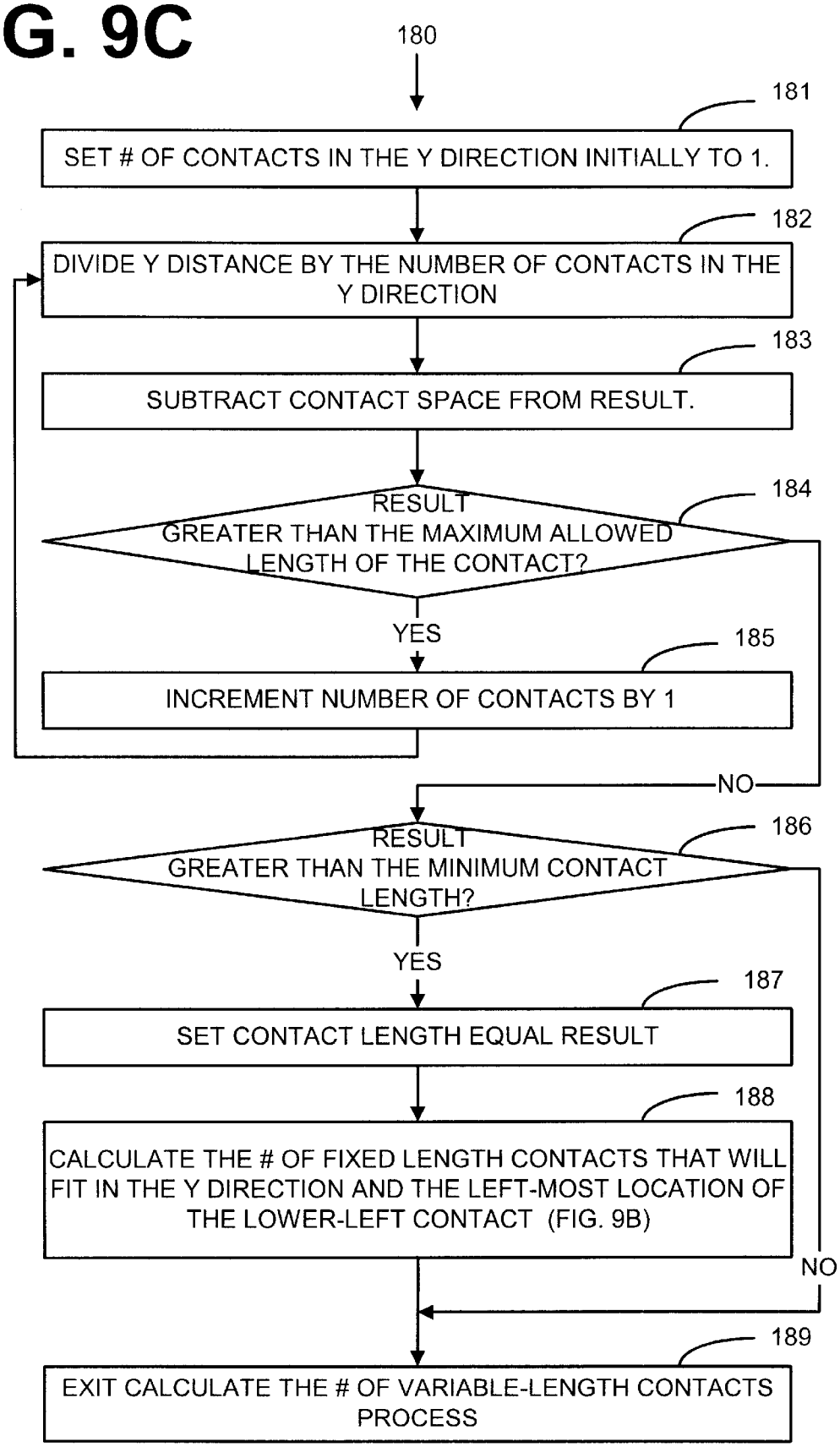
FIG. 9C is the flow chart of the variable length contacts process that calculates the number of variable length contacts, as shown in FIGS. 1 and 9A.

Illustrated in FIG. 9C is the process 180 that calculates the number of variable length contacts within the given dimension of the rectangular portion of the shape. This process is hereafter referred to as the calculate variable length contacts process 180. First at step 181, the calculate variable length contacts process 180 sets the number of contacts in the Y direction initially to one (1). Next at step 182, the distance in the Y direction is divided by the number of contacts in the Y direction. At step 183 the contacts based is subtracted from the result of step 182.

At step 184, the calculate variable length contacts process 180 determines if the result is greater than the maximum allowed length of the contact. If the result is greater than the maximum allowed length of the contact, the number of contacts is incremented by 1, and the calculate variable length contacts process 180 returns to repeat steps 182 through 185.

If it is determined at step 184 that the result is not greater than the maximum allow length of the contact, the calculate variable length contacts process 180 then determines if the result is greater than the minimum contact length at step 186. If it is determined at step 186 that the result is not greater than the minimum contact length, the calculate variable length contacts process 180 proceeds to exit at step 189.

If is determined at step 186 that the result is greater than the minimum contact a length the calculate variable length contacts process 180 sets the contact length equal to the result (i.e. fixes the contact length) at step 187. Next at step 188, the calculate variable length contacts process 180 executes the process to calculate the number of fixed length contacts that will fit in the Y direction at step 164 (FIG. 9B)

and the left most location of the lower contact. The calculate variable length contacts process 180 then exits at step 189.

Illustrated in FIGS. 10A–10D, are block diagrams illustrating the of exclusion zones to be processed for omitting contacts. Exclusion zone consists of those areas where the auto-contactor system 60 is not allowed to place contacts. Specifically, generated contacts may touch the exclusion zone, but may not overlap or lie entirely within the exclusion zone. The purpose of the exclusion zone is to prevent contact spacing rules when two blocks which have been autocontacted are placed next to each other in a higher level block with their block boundaries touching. It also avoids placing contacts in regions occupied by child blocks, based on the assumption that child blocks usually have the contacts they need and don't need additional contacts. There are at least three types of exclusion zones, and they are computed as follows:

Type 1. The block boundary of the block being autocontacted is shrunken by one half the minimum allowed contact spacing distance. All area outside this shrunken boundary is excluded. This is illustrated in FIGS. 10A and 10D.

Type 2. Existing contacts within the block being contacted and within child blocks are expanded by the minimum contact spacing distance. These expanded contact areas are excluded. This is illustrated in FIGS. 10B and 10D).

Type 3. Areas within child block boundaries are excluded by default, however, this exclusion can be overridden by various mechanisms so that the auto-contactor system 60 may place contacts in the regions occupied by child blocks, if desired by the designer. These designer allowed areas are in turn overridden by the exclusions noted in the previous two paragraphs. This is illustrated in FIGS. 10C and 10D).

Figure 10A:
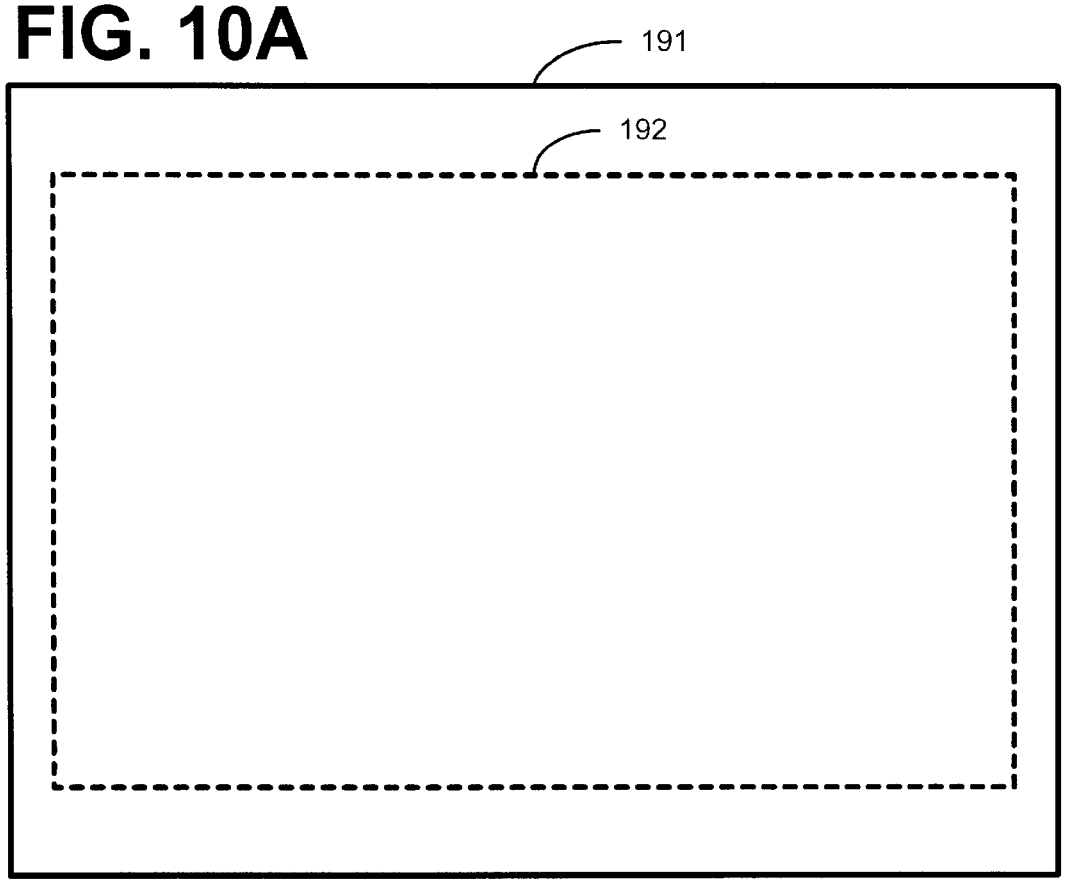
FIG. 10A is a block diagram representative of the first type of exclusion zone that is a result of the creation of the masked specifying zones where contacts are excluded as shown in FIG. 5B.

FIG. 10A is representative of the first type of exclusion zone. The first type of exclusion zone is an illustrated with the block bound 191 and the block bound shrunken by one half the contact size 192. The block bound shrunken by one half the contact size 192, is a result of the creation of the masked specifying zones where contacts are excluded. The creation of the exclusion zone between block 192 and block 191 is performed at step 102 (FIG. 5B).

Figure 10B:
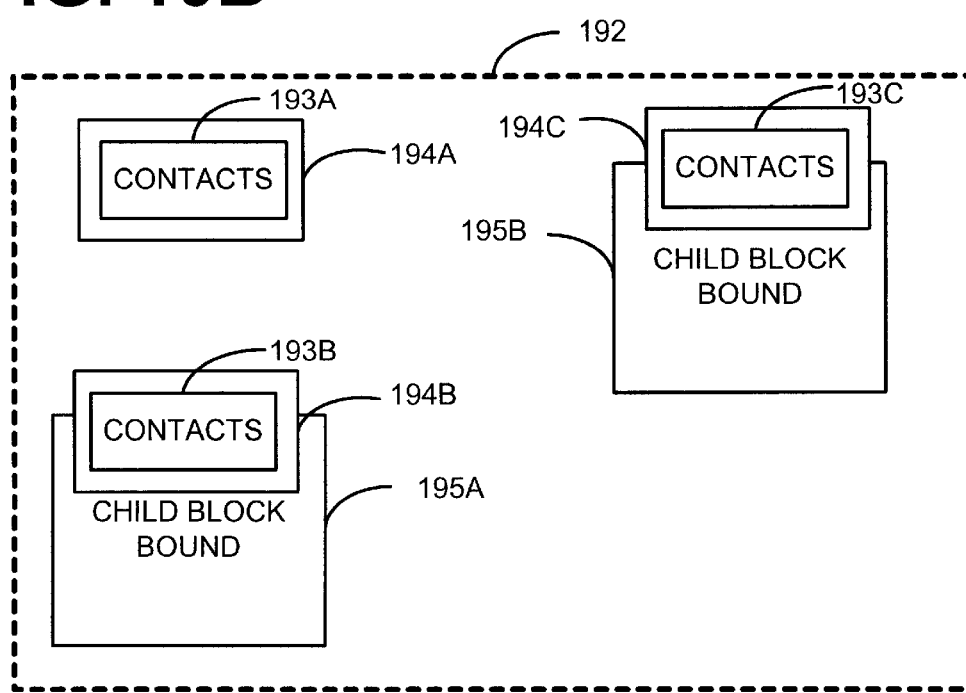
FIG. 10B is a block diagram representative of the second type of exclusion zone around each contact, as shown in FIG. 5B.

FIG. 10B is representative of the second type of exclusion zone. The second type of exclusion zone is illustrated as an exclusion area 194 (A–C) around each contact 193 (A–C). The creation of the exclusion zone around each contact 193 (A–C) is also performed at step 102 (FIG. 5B).

Figure 10C:
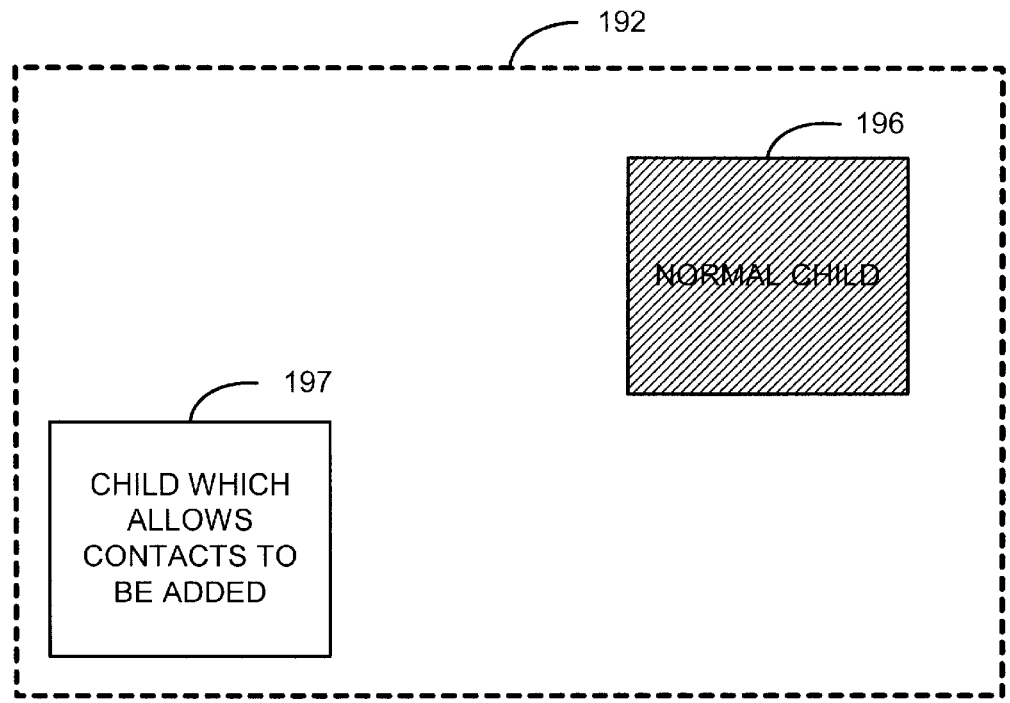
FIG. 10C is a block diagram representative of the third type of exclusion zone as an normal child block exclusion area, as shown in FIG. 5B.
Figure 10D:
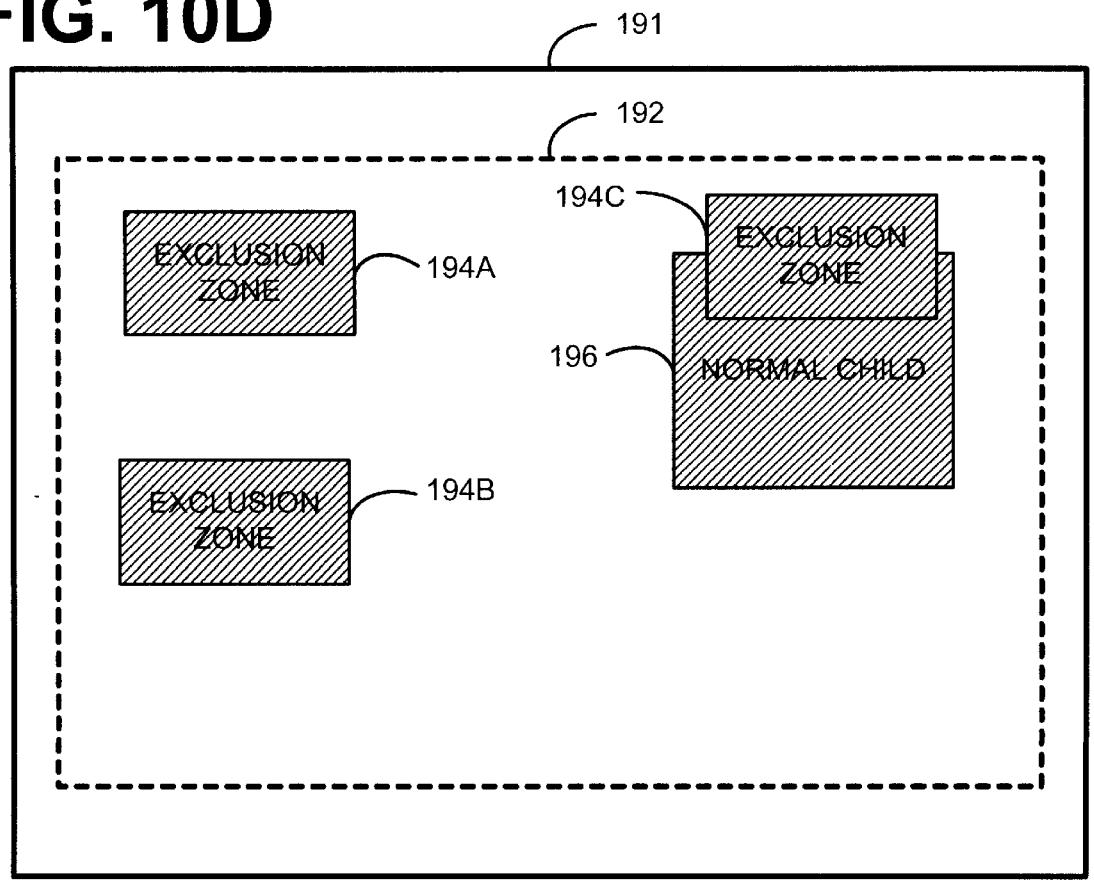
FIG. 10D is a block diagram showing of the all types of exclusion zones, as shown in FIGS. 10A–10C.

FIG. 10C is representative of the third type of exclusion zone. The third type of exclusion zone is illustrated as an normal child block exclusion area. Normal child block exclusion area 195B differs from child block bound 195A 194 (A–C) in that child block 195A allows contacts to be added. The creation of the normal child block exclusion area 195B is also performed at step 102 (FIG. 5B).

FIG. 10D is representative of the all types of exclusion zones, as shown in FIGS. 10A–10C.

Figure 11A:
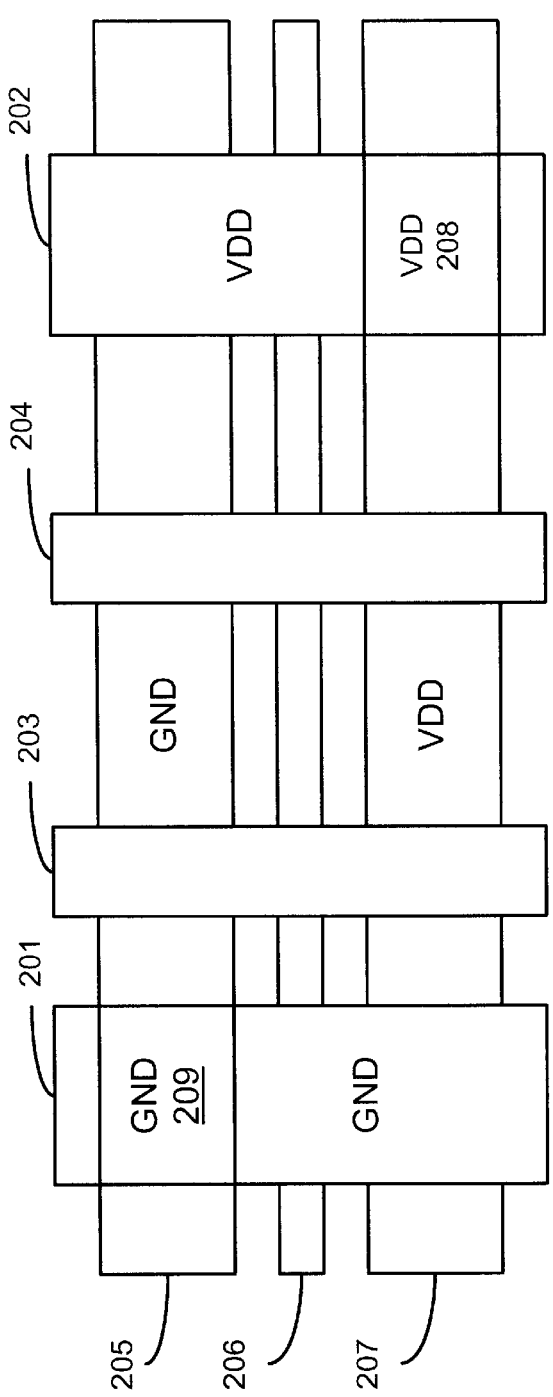
FIG. 11A is a block diagram of the signal lines that are placed on adjacent layers within an IC chip, as shown in FIG. 3A.
Figure 11B:
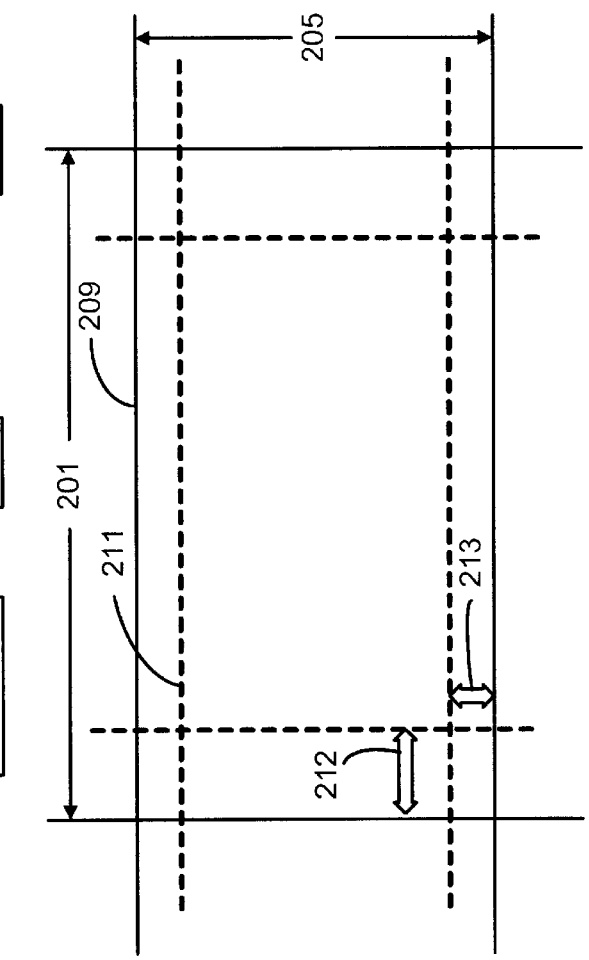
FIG. 11B is a block diagram illustrating the enclosure distance within a contactable area for adding individual contacts as illustrated in FIGS. 9A–9C and 10A.

Illustrated in FIGS. 11A and 11B are block diagrams illustrating the contact areas to be processed for contacts and the result of the operations performed on each contact shape.

Illustrated in FIG. 11 A is a block diagram representative of the VDD, ground, and signal lines on adjacent metal layers within an IC chip. As shown, the signals on th e upper layer run perpendicular to the signals on the lower layer. This is typical of how metal lines are routed on the upper layers of an IC, however, the auto-contactor system 60 does not require or enforce any particular routing practice. It should be obvious to those of ordinary skill in the art that the signal lines could be reversed where the signal lines on the upper layer run in a direction perpendicular to the current orientation or that the signal lines on each side of a layer could run parallel instead of perpendicular. However, in the preferred embodiment, the signal lines run perpendicular across the surface of each IC chip layer. As previously stated, the signal lines 201 through 204 reside on the upper side of an IC chip layer, such as for example, signal lines 52 and 53 (FIG. 3B), and the signal lines 205 through 207 reside on the bottom side of the IC chip layer, such as for example, signal lines 55–57 (FIGS. 3B and 3C). Blocks 209 and 208 illustrate the intersecting signal area 209 to be processed for contacts through the IC chip layer.

FIG. 11B illustrates a more detailed display of the region where the ground signals cross. Shown is the top layer ground signal 201 running perpendicular to the bottom layer ground signal 205. Within the intersecting signal area is the contact area 211 (crosshatched) where contacts are to be placed. This contactable area 211 is constructed by shrinking each metal shape 201 and 205 by the minimum contact enclosure distance in step 105 (in FIG. 5B). "Enclosure" of contact X by metal Y is independent of contact size, i.e., it's a separate variable, not derived from contact size. The minimum contact enclosure distance is shown by items 212 and 213. A grid is the most basic unit of measurement for all designs supplied. For example, if a grid is 1 micron, then half that size would be .5 microns and then everything would be a multiple of that grid size. This is done to insure that no contact is closer than a width or height equal to one contact to any other contact in the contactable area 211.

Figure 11D:
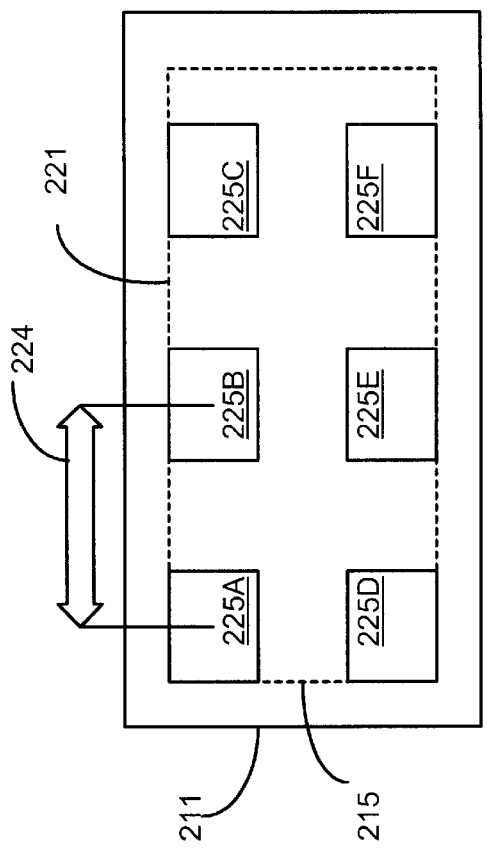
FIG. 11D is a block diagram that illustrates the overall view of the contact placement within the excluded mask area as illustrated in FIGS. 10A–10D, 11A and 11B.
Figure 11C:
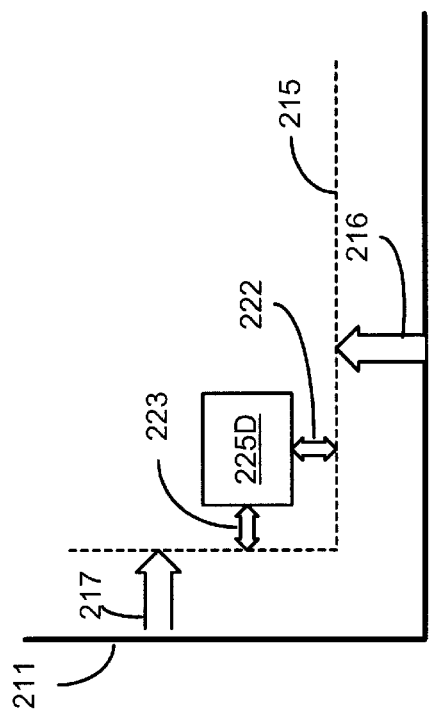
FIG. 11C is a block diagram that illustrates the offset and placement of the contact within the contactable area as illustrated in FIGS. 10A–10D, 11A and 11B.

Illustrated in FIG. 11C is the contactable area 211 and the contactable area 215 as process at step 105 (FIG. 5B). Shown is the offset and placement of the contact within the contactable area 211. Shown is the excluded mask area between contactable area 215 and contactable area 211 with the offsets 216 and 217. Furthermore, shown are the offsets of one-half of a grid size 222 and 223 for the placement of contact 225.

Illustrated in FIG. 11D is the overall view of the contact placement within the excluded mask area between contactable area 215 and contactable area 211 for contacts 225A–225F. Also illustrated is the area 221 occupied by contacts. This area is subtracted from the shape, stored in the contractible area process 80 (FIG. 5A) if there are more than one rectangle to be contacted. Also illustrated by 221 is the number of contacts times the pitch. The pitch could be defined as the area between the center point of each contact and is illustrated by offset 224.

Illustrated in FIGS. 12A through 12D are an example of the processing taking place for a intersection shape generated by irregular shaped signal lines 231 and 232.

Figure 12A:
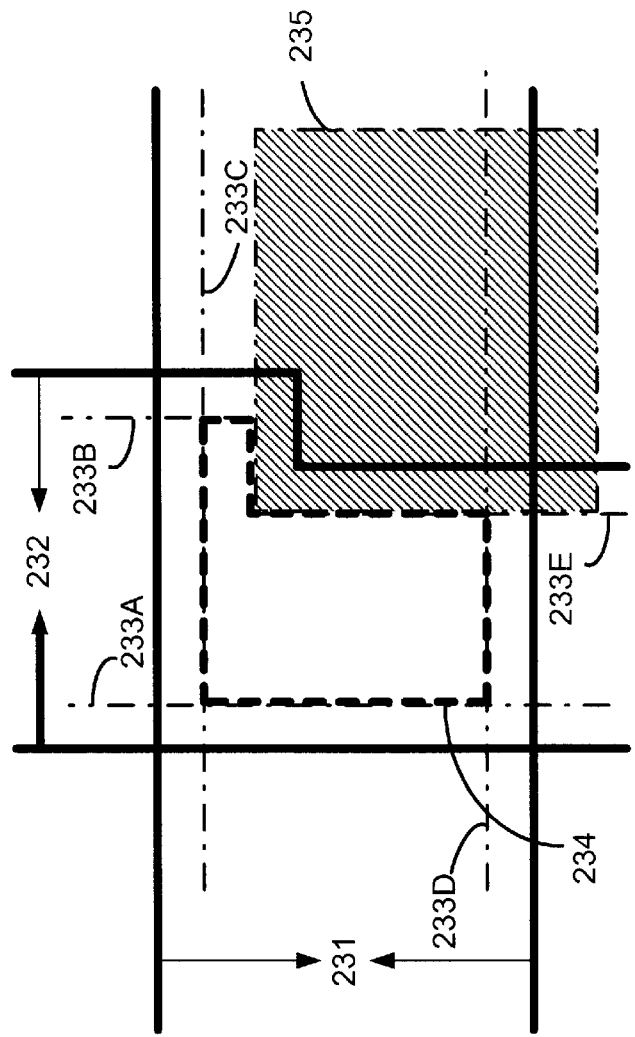
FIGS. 12A–12D are block diagrams illustrating an example of an area that is to be processed by the auto-contactor system for the automatic adding of contacts from one layer to another for same-named signals as illustrated in FIG. 5B.
Figure 12D:
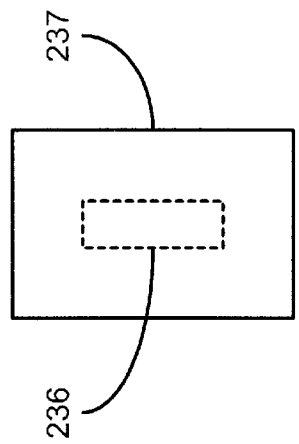
Figure 12C:
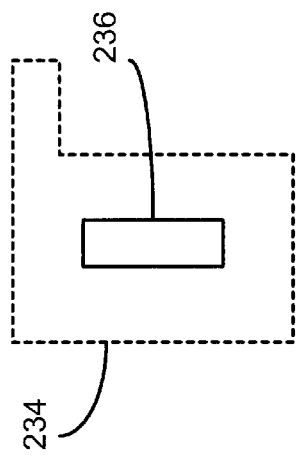
Figure 12B:
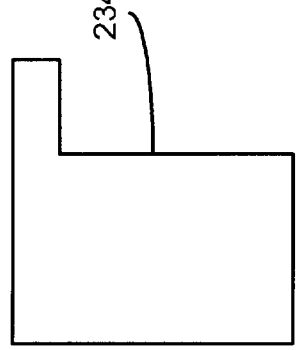

Illustrated in FIG. 12A are the metal lines shrunken by the minimum contact enclosure amount (lines 233A–233D) as determined at step 105 (FIG. 5B). These shrunken areas are used to derive the initial contactable area 234 at step 106 (FIG. 5B). The irregular shaped intersection shape is created as a result of the signal intersection. overlapping exclusion zone 235.

Illustrated in FIG. 12B is the initial contactable area 234 without the metal lines, and illustrated in FIG. 12C is the initial contactable shape 234 with the shrunken contactable space 236 as determined at step 108 (FIG. 5B). The expansion of area 236 into the resulting contactable area 237 is illustrated in FIG. 12D. The expansion of area is determined at step 108 (FIG. 5B) and is to be utilized for the placement of contacts.

Illustrated in FIGS. 13A through 13F is another example of the processing of irregular shaped signal lines for the placement of contacts by the auto-contactor system 60, showing how nearby contactable shapes are connected by fine lines.

Illustrated in FIG. 13A are the metal lines shrunken by the minimum contact enclosure amount (lines 245) as determined at step 105 (FIG. 5B). The shrunken areas are used to derive the initial contactable areas 243 and 244 resulting from the intersection of the shrunken signal lines 245 and 246 determined at step 106 (FIG. 5B). The vertical zigzag shape (241) is on one metal layer and the horizontal shape (242) is on the other. Shapes 243 and 244 are the shapes that resulted from steps 105 through 108 (FIG. 5B).

Illustrated in FIG. 13B are the initial contactable areas 243 and 244 shown without the metal lines. In FIG. 13C the contactable shapes 243C and 244C are shrunken as determined at step 108 (FIG. 5B). Illustrated in FIG. 13D is the expansion of areas 243D and 244D into the resulting contactable areas as determined at step 108 (FIG. 5B) to be utilized for the placement of contacts.

Illustrated in FIG. 13E is the creation of a shape 245 which overlaps areas 243E and 244E that are closer than the minimum contact spacing as determined at step 109 (FIG. 5B). FIG. 13F shows the additional thin rectangle 245F. The additional thin rectangle 245F is added to the final shape to be processed in order to guarantee that proper space is maintained between contacts. This guarantees that shapes 243F and 244F are processed at the same time at step 109 (FIG. 5B).

Figure 14A:
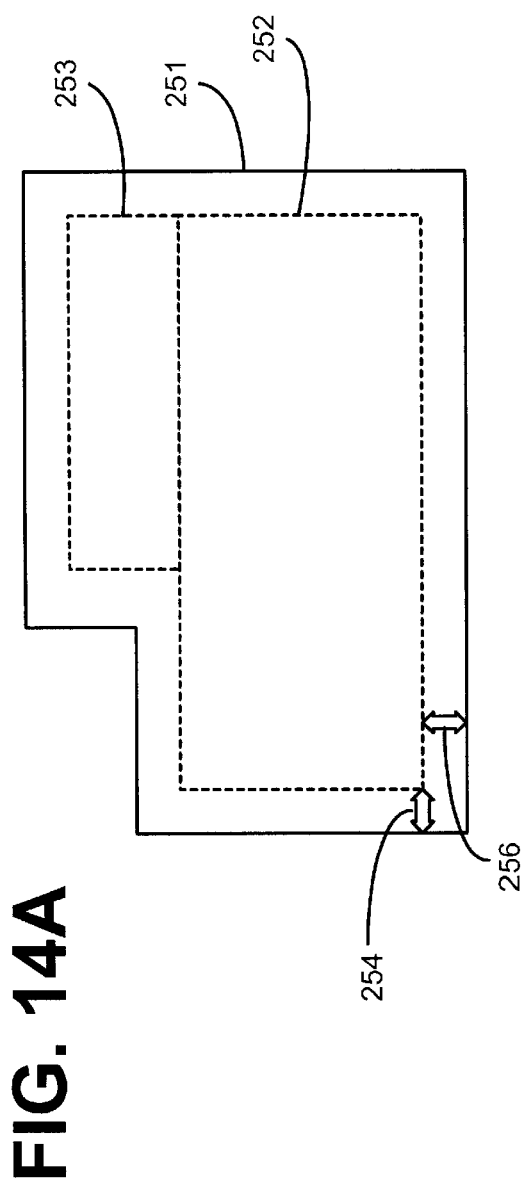
FIGS. 14A–14C are block diagrams illustrating the process of the auto-contactor system of the present invention for contactable areas, which are not rectangular as illustrated in FIG. 5A, 5B, 8 and 9A–9C.
Figure 14C:
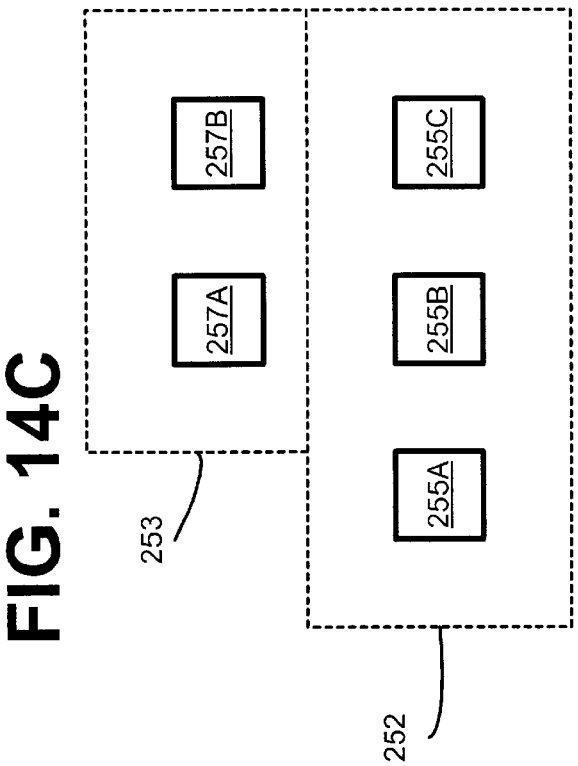
Figure 14B:
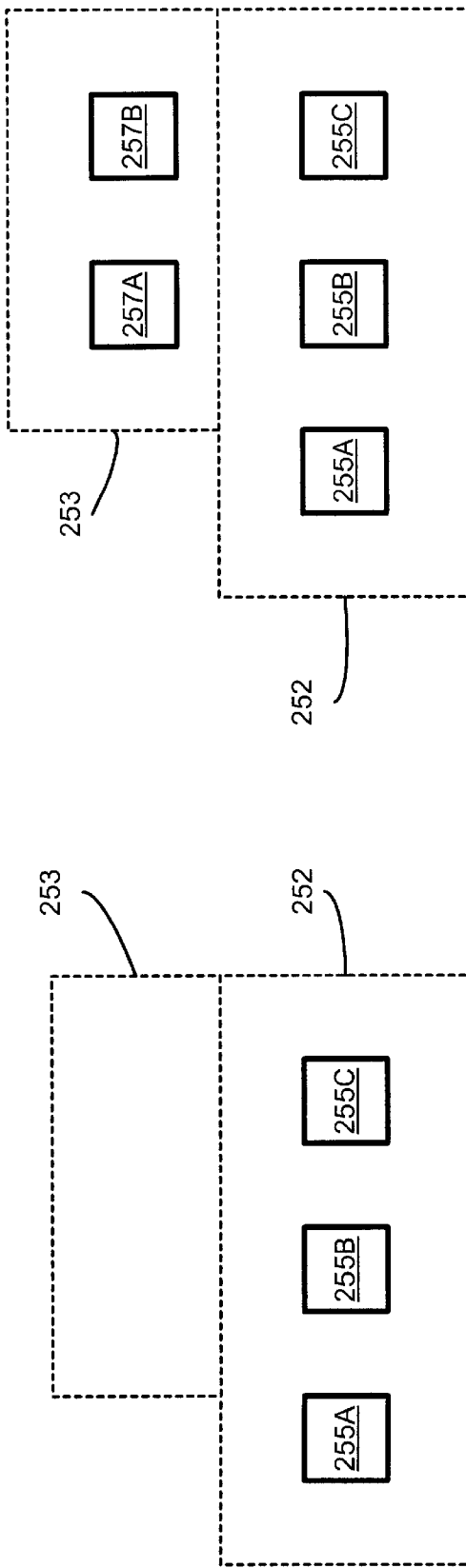

Illustrated in FIGS. 14A through 14C is another example of the processing performed by the auto contactor system 60 for non-rectangular contactable areas.

FIG. 14A illustrates a non-rectangular contact area. When such an irregular contactable area 251 shape is processed (shrunk by shrink amount), the contactable area process 80 (FIG. 5A) generates the resulting non-overlapping rectangles 252 and 253.

Illustrated in FIG. 14B is the initial placement of contacts 255A through 255C in the contactable area 252 as described in FIGS. 8 and 9A–9C.

Illustrated in FIG. 14C is the placement of contacts 257A and 257B within the non-overlapping rectangles 252 and 253 respectively as described in FIGS. 8 and 9A–9C.

The flowcharts of FIGS. 4–9C show the architecture, functionality, and operation of a possible implementation of the auto-contactor system 60. In this regard, each block represents a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved, as clarified hereinabove.

The auto-contactor system 60, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In concluding the detailed description, it should be noted that it will be obvious to those skilled in the art that many variations and modifications may be made to the preferred embodiment without substantially departing from the principles of the invention. All such variations and modifications are intended to be included herein within the scope of the present invention, as set forth in the following claims. Further, in the claims hereafter, the structures, materials, acts, and equivalents of all means or step plus function elements are intended to include any structures, materials, or acts for performing the recited functions in combination with the other claimed elements as specifically claimed.

What is claimed is:

1. A method that optimizes the placement and size of contact elements for connecting a signal line on a first layer of the integrated circuit to a signal line on a second layer of the integrated circuit that comprises the following steps:

identifying a contact area that overlaps the signal line on the first layer of the integrated circuit and the signal line on the second layer of the integrated circuit;

calculating an optimal size of a plurality of contacts in said contact area to provide optimal electrical contact.

2. The method of claim 1, wherein said calculating an optimal size step further comprises the step of:

calculating an optimal number of said plurality of contacts that will fit in said contact area.

3. The method of claim 2, wherein said calculating an optimal number step further comprises the step of:

calculating an optimal number of said plurality of contacts in a first predetermined size that will fit in a first plane of said contact area.

4. The method of claim 2, wherein said calculating an optimal number step further comprises the steps of:

calculating an optimal number of said plurality of contacts in a second predetermined size that will fit in a second plane of said contact area; and calculating an optimal number of said plurality of contacts in a variable size that will fit in said second plane of said contact area.

5. The method of claim 4, wherein said calculating an optimal number step further comprises the steps of:

selecting said optimal number of said plurality of contacts in said variable size that will fit in said second plane if said optimal number of said plurality of contacts provides a greatest electrical contact for a selected fabrication type; and selecting said optimal number of said plurality of contacts in said fixed size that will fit in said second plane if said optimal number of said plurality of contacts provides the greatest electrical contact for the selected fabrication type.

6. The method of claim 1, wherein said identifying a contact area that overlaps the signal line step further comprises the steps of:
   finding areas for a signal on the first layer of the integrated circuit;
   finding areas for said signal on the second layer of the integrated circuit;
   determining all area intersections of said signal on the first layer of the integrated circuit and said signal on the second layer of the integrated circuit; and
   selecting one area intersection from said all area intersections as said contact area.

7. The method of claim 6, further comprising the steps of:
   removing said one area intersection from said all area intersections; and
   selecting a second area intersection from said all area intersections as said contact area.

8. A system for optimizing the placement and size of contact elements for connecting a signal line on a first layer of the integrated circuit to a signal line on a second layer of the integrated circuit, comprising:
   a contact area mechanism that identifies a contact area that overlaps the signal line from the first layer of the integrated circuit and the signal line on the second layer of the integrated circuit;
   an optimizing mechanism that calculates an optimal size of a plurality of contacts in said contact area to provide optimal electrical contact.

9. The system of claim 8, further comprising:
   an optimal number mechanism that calculates an optimal number of said plurality of contacts that will fit in said contact area.

10. The system of claim 9, wherein said optimal number mechanism further comprises:
    a first plane calculating mechanism that calculates an optimal number of said plurality of contacts in a first predetermined size that will fit in a first plane of said contact area.

11. The system of claim 10, wherein said optimal number mechanism further comprises:
    a second plane calculating mechanism that calculates an optimal number of said plurality of contacts in a second predetermined size that will fit in a second plane of said contact area; and
    a second plane variable calculating mechanism that calculates an optimal number of said plurality of contacts in a variable size that will fit in said second plane of said contact area.

12. The system of claim 11, wherein said optimal number mechanism further comprises:
    a variable selecting mechanism that selects said optimal number of said plurality of contacts in said variable size that will fit in said second plane if said optimal number of said plurality of contacts provides a greatest electrical contact for a selected fabrication type; and
    a selecting mechanism that selects said optimal number of said plurality of contacts in said fixed size that will fit in said second plane if said optimal number of said plurality of contacts provides the greatest electrical contact for the selected fabrication type.

13. The system of claim 8, wherein said contact area mechanism further comprises:
    a first layer identification mechanism that finds areas for a signal on the first layer of the integrated circuit;
    a second layer identification mechanism that finds areas for said signal on the second layer of the integrated circuit;
    an intersection mechanism that determines all area intersections of the signal on the first layer of the integrated circuit and the signal on the second layer of the integrated circuit; and
    an intersection selecting mechanism that selects one area intersection from said all area intersections.

14. The system of claim 13, wherein the contact area mechanism further comprises:
    a removal mechanism that removes said one area intersection from said all area intersections; and
    a reduced intersection selecting mechanism that selects a second area intersection from said all area intersections as said contact area.

15. A computer readable medium for optimizing the placement and size of contact elements for connecting a signal line on a first layer of the integrated circuit to a signal line on a second layer of the integrated circuit, comprising:
    a first code segment recorded on said medium configured to identify a contact area that overlaps the signal line from the first layer of the integrated circuit and the signal line on the second layer of the integrated circuit;
    a second code segment recorded on said medium configured to calculate an optimal size of a plurality of contacts in said contact area to provide optimal electrical contact.

16. The medium of claim 15, wherein said second code segment recorded on said medium configured to calculate an optimal number logic further comprises:
    logic for calculating an optimal number of said plurality of contacts that will fit in said contact area.

17. The medium of claim 15, wherein said second code segment further comprises:
    logic for calculating an optimal number of said plurality of contacts in a first predetermined size that will fit in a first plane of said contact area.

18. The medium of claim 15, wherein said second code segment further comprises:
    logic for calculating an optimal number of said plurality of contacts in a second predetermined size that will fit in a second plane of said contact area; and
    logic for calculating an optimal number of said plurality of contacts in a variable size that will fit in said second plane of said contact area.

19. The medium of claim 18, wherein said calculating an optimal number logic further comprises:
    logic for selecting said optimal number of said plurality of contacts in said variable size that will fit in said second plane if said optimal number of said plurality of contacts provides a greatest electrical contact for a selected fabrication type; and
    logic for selecting said optimal number of said plurality of contacts in said fixed size that will fit in said second plane if said optimal number of said plurality of contacts provides the greatest electrical contact for the selected fabrication type.

20. The medium of claim 15, wherein said first code segment recorded on said medium configured to identify a contact area further comprises:

logic for finding areas for a signal on the first layer of the integrated circuit;

logic for finding areas for said signal on the second layer of the integrated circuit;

logic for determining all area intersections of said signal on the first layer of the integrated circuit and said signal on the second layer of the integrated circuit; and logic for selecting one area intersection from said all area intersections as said contact area.

21. The medium of claim 20, wherein said first code segment recorded on said medium configured to identify a contact area further comprises:

logic for removing said one area intersection from said all area intersections; and logic for selecting a second area intersection from said all area intersections as said contact area.

* * * * *